US011257946B2

(12) United States Patent
Griebl et al.

(10) Patent No.: US 11,257,946 B2
(45) Date of Patent: Feb. 22, 2022

(54) METHOD OF FORMING A POWER SEMICONDUCTOR DEVICE

(71) Applicant: Infineon Technologies Dresden GmbH & Co. KG, Dresden (DE)

(72) Inventors: Erich Griebl, Dorfen (DE); Markus Beninger-Bina, Grosshelfendorf (DE); Matteo Dainese, Munich (DE); Ingo Dirnstorfer, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/737,130

(22) Filed: Jan. 8, 2020

(65) Prior Publication Data

US 2020/0235235 A1 Jul. 23, 2020

(30) Foreign Application Priority Data

Jan. 18, 2019 (DE) .......................... 102019101304.6

(51) Int. Cl.
*H01L 29/78* (2006.01)
*H01L 29/08* (2006.01)
(Continued)

(52) U.S. Cl.
CPC ........ *H01L 29/7813* (2013.01); *H01L 21/266* (2013.01); *H01L 21/26513* (2013.01);
(Continued)

(58) Field of Classification Search
CPC ............. H01L 29/7813; H01L 29/0865; H01L 29/0869; H01L 21/26513; H01L 21/30604;
(Continued)

(56) References Cited

U.S. PATENT DOCUMENTS

2005/0167748 A1\* 8/2005 Onda ................ H01L 29/66734
257/341
2010/0078714 A1\* 4/2010 Tu ........................ H01L 29/1095
257/330
(Continued)

FOREIGN PATENT DOCUMENTS

JP       2006120894 A  *  5/2006

*Primary Examiner* — Mohammad M Hoque
(74) *Attorney, Agent, or Firm* — Murphy, Bilak & Homiller, PLLC

(57) ABSTRACT

A method of forming a power semiconductor device includes: arranging a control electrode at least partially on or inside a semiconductor body; forming elevated source regions in the semiconductor body by: implanting first conductivity type dopants into the semiconductor body; forming a recess mask layer covering at least areas of intended source regions; and removing portions of the semiconductor body uncovered by the recess mask layer to form the elevated source regions and recessed body regions at least partially between the source regions. A dielectric layer is formed on the semiconductor body. A contact hole mask layer is formed on the dielectric layer. Portions of the dielectric layer uncovered by the contact hole mask layer are removed to form a contact hole which is filled at least partially with a conductive material to establish an electrical contact with at least a portion of the elevated source and recessed body regions.

17 Claims, 18 Drawing Sheets

(51) Int. Cl.
  *H01L 21/265* (2006.01)
  *H01L 21/306* (2006.01)
  *H01L 21/266* (2006.01)
  *H01L 29/417* (2006.01)
  *H01L 29/10* (2006.01)
  *H01L 21/308* (2006.01)
  *H01L 29/66* (2006.01)
  *H01L 29/739* (2006.01)
  *H01L 21/324* (2006.01)

(52) U.S. Cl.
  CPC ...... *H01L 21/308* (2013.01); *H01L 21/30604* (2013.01); *H01L 21/324* (2013.01); *H01L 29/0865* (2013.01); *H01L 29/0869* (2013.01); *H01L 29/1095* (2013.01); *H01L 29/41741* (2013.01); *H01L 29/6634* (2013.01); *H01L 29/66727* (2013.01); *H01L 29/7397* (2013.01); *H01L 29/7811* (2013.01)

(58) Field of Classification Search
  CPC ............. H01L 21/266; H01L 29/41741; H01L 29/1095; H01L 29/7811; H01L 21/308; H01L 29/66727; H01L 29/6634; H01L 29/7397; H01L 21/324; H01L 29/7396; H01L 29/7802; H01L 29/41766; H01L 29/407; H01L 29/0696; H01L 29/66348; H01L 29/66734; H01L 29/66325; H01L 29/66477; H01L 29/0847; H01L 29/7393; H01L 29/07
  USPC ......................................................... 257/330
  See application file for complete search history.

(56) References Cited

U.S. PATENT DOCUMENTS

| | | | |
|---|---|---|---|
| 2011/0254088 A1 | 10/2011 | Darwish et al. | |
| 2013/0037881 A1* | 2/2013 | Mizokuchi | H01L 21/32133 257/330 |
| 2016/0086804 A1* | 3/2016 | Noguchi | H01L 29/4236 438/270 |
| 2018/0366569 A1 | 12/2018 | Zeng et al. | |
| 2019/0057873 A1* | 2/2019 | Sugahara | H01L 23/522 |

* cited by examiner

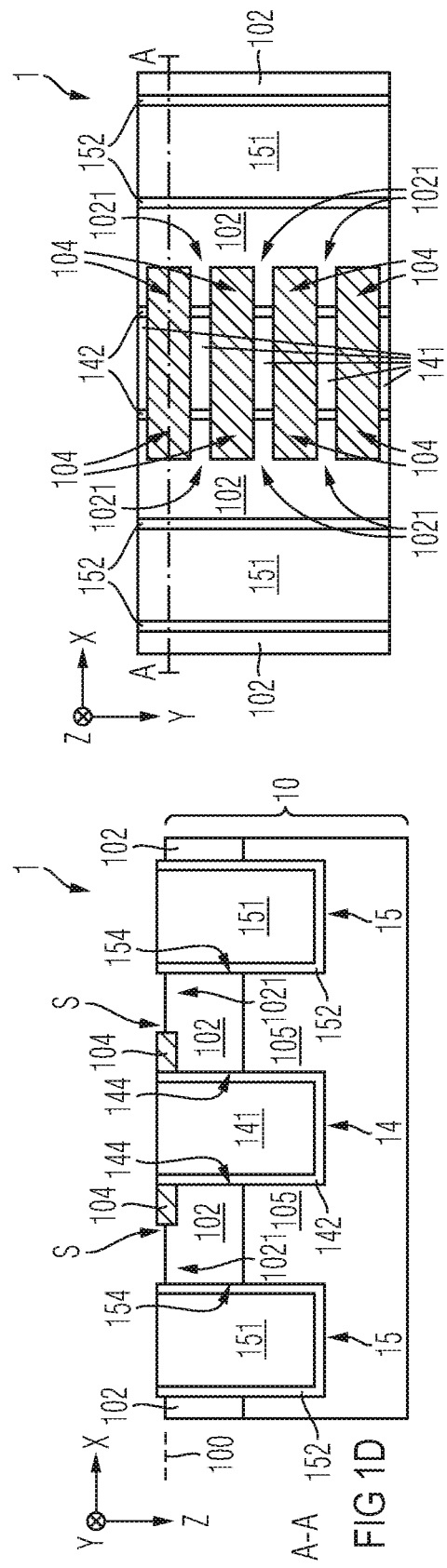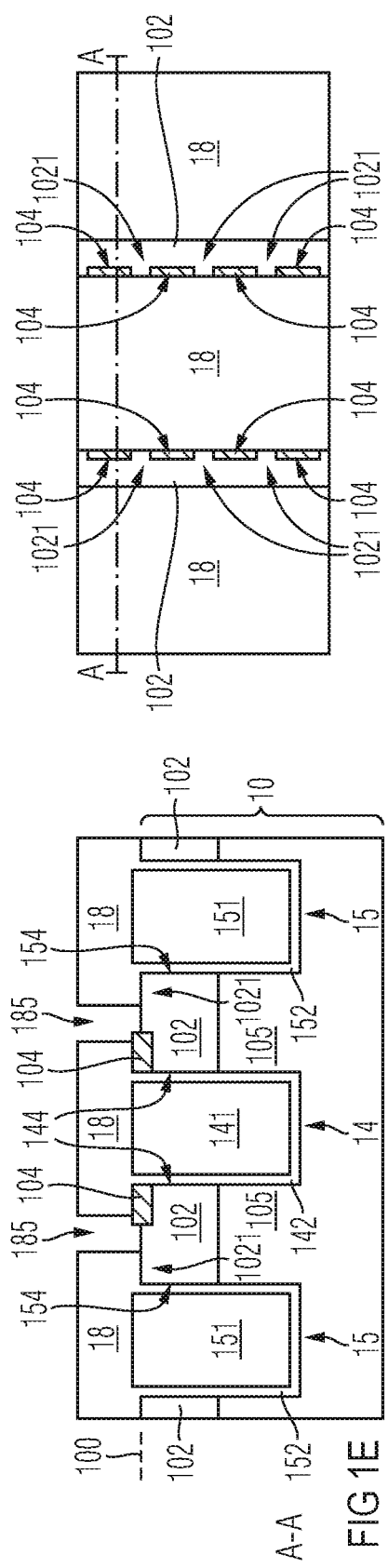

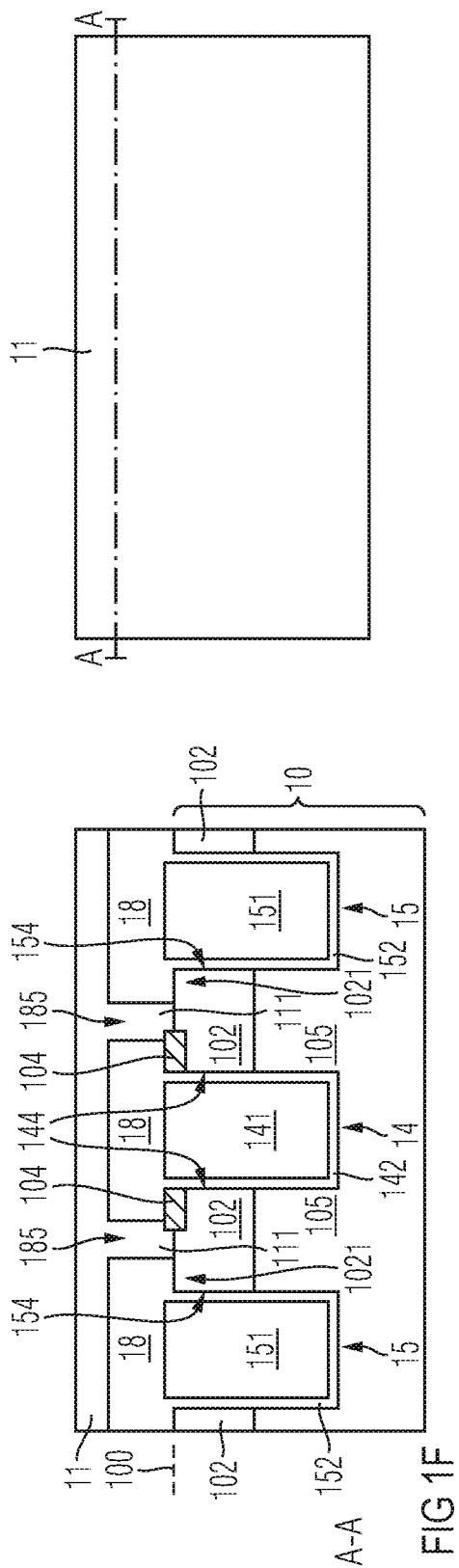

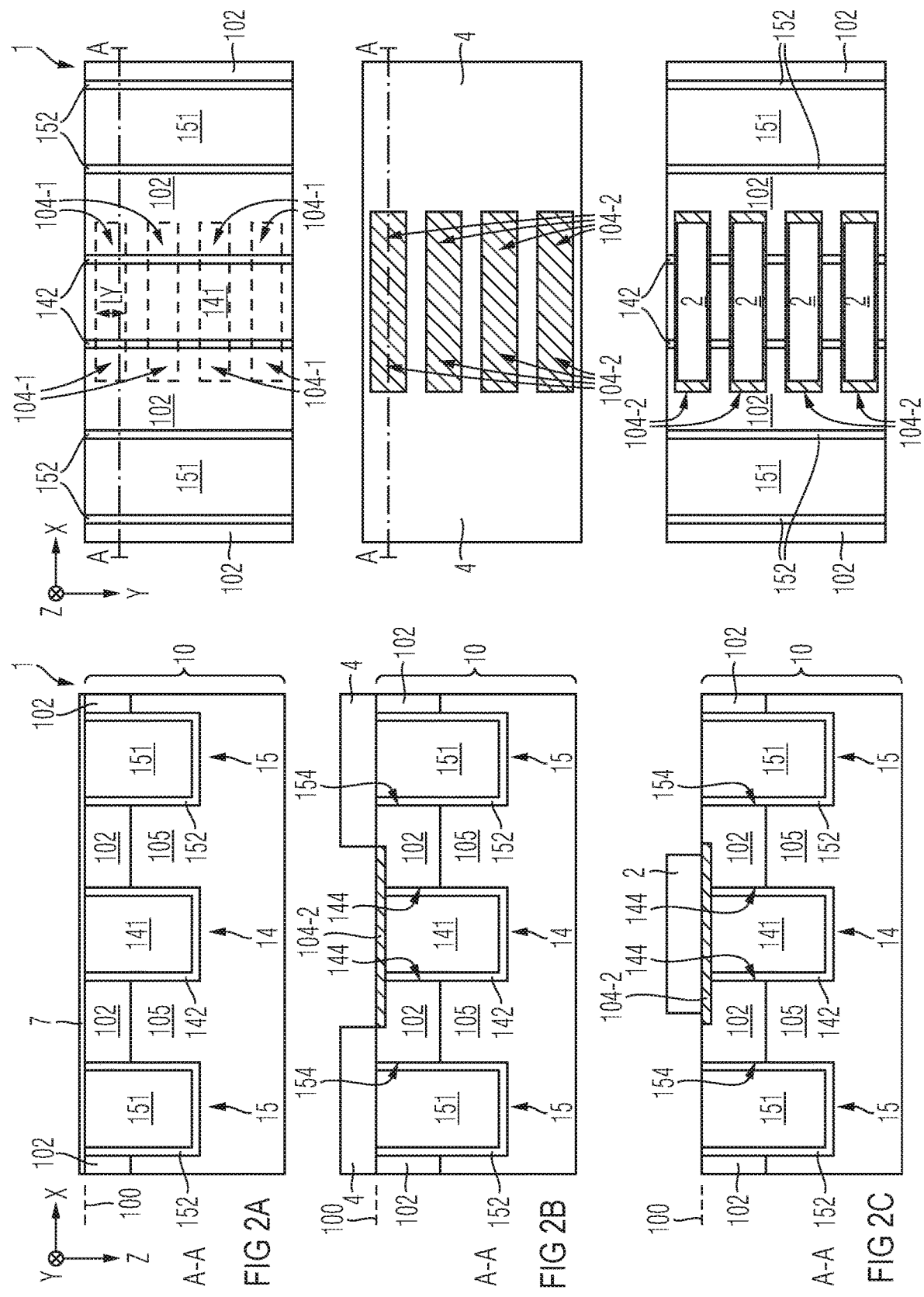

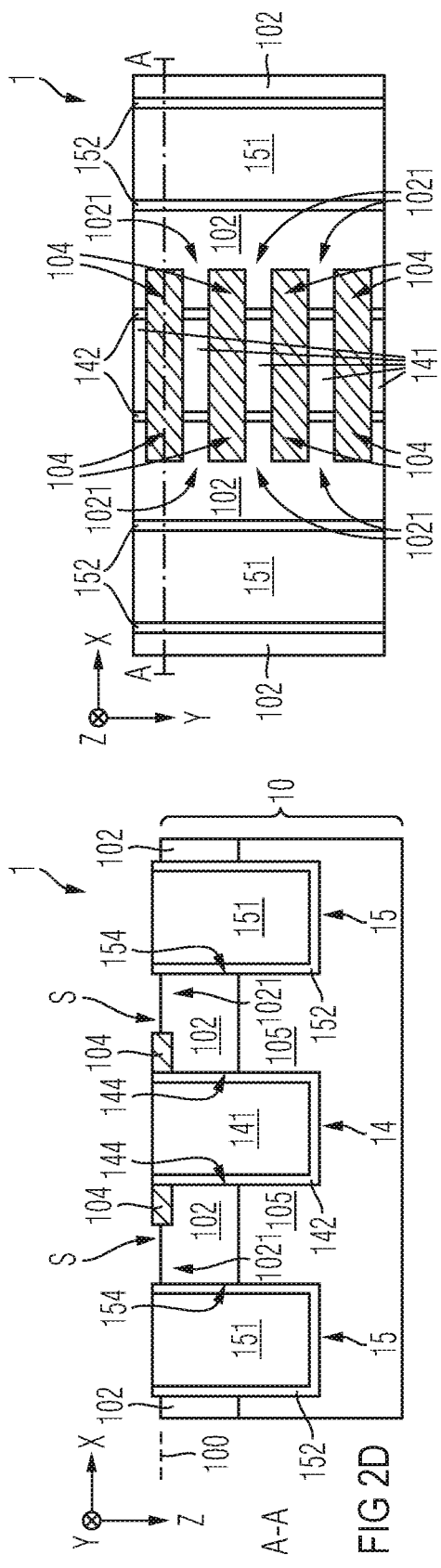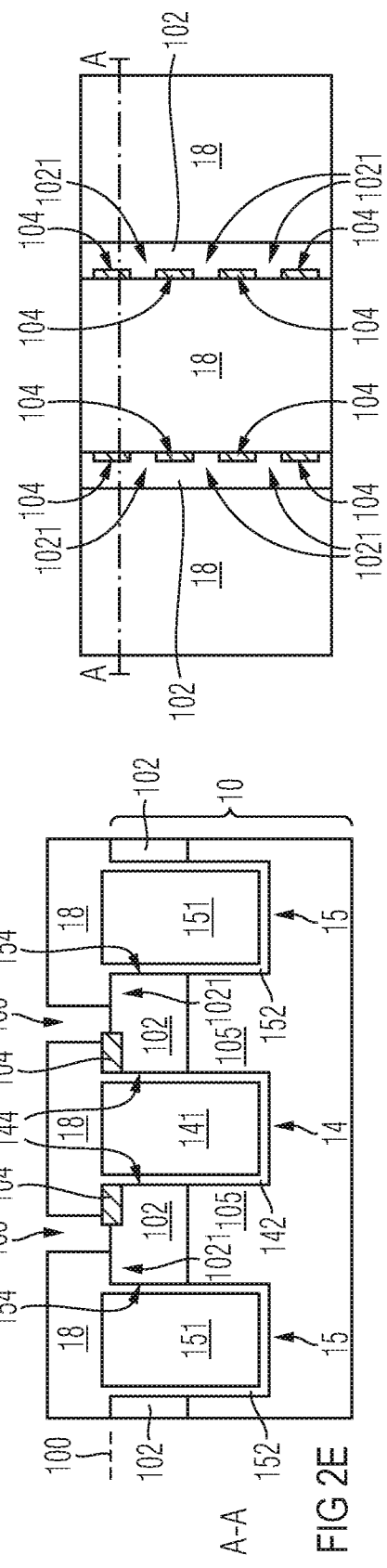

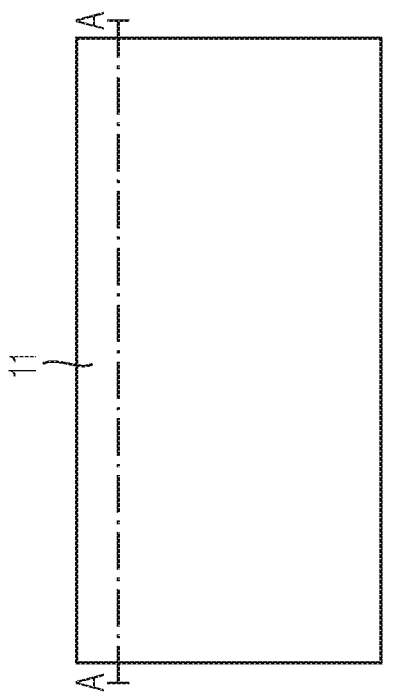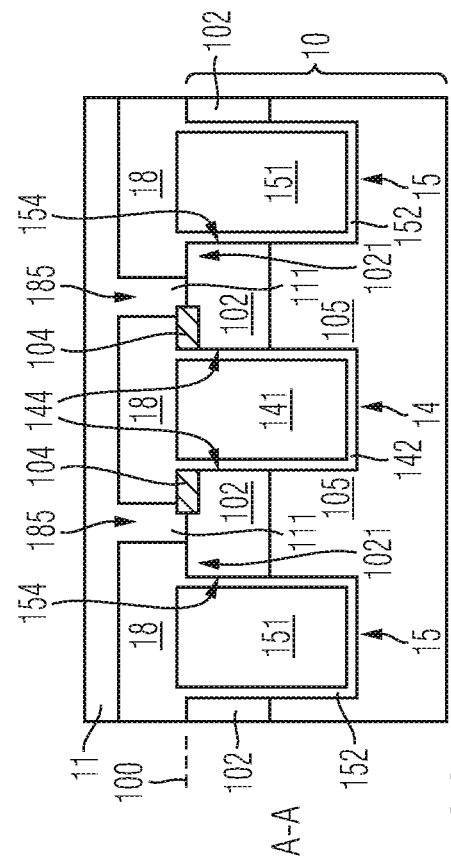

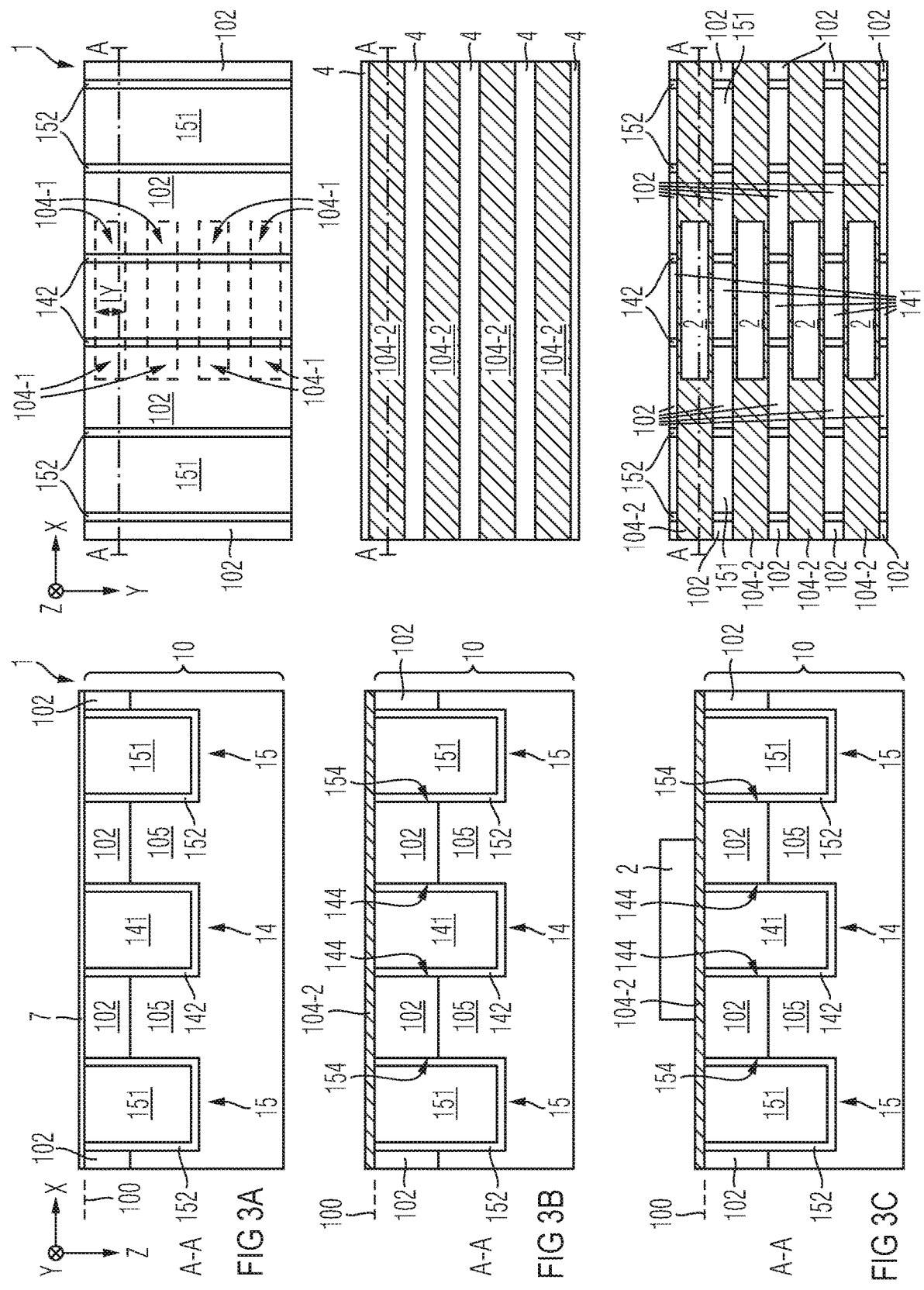

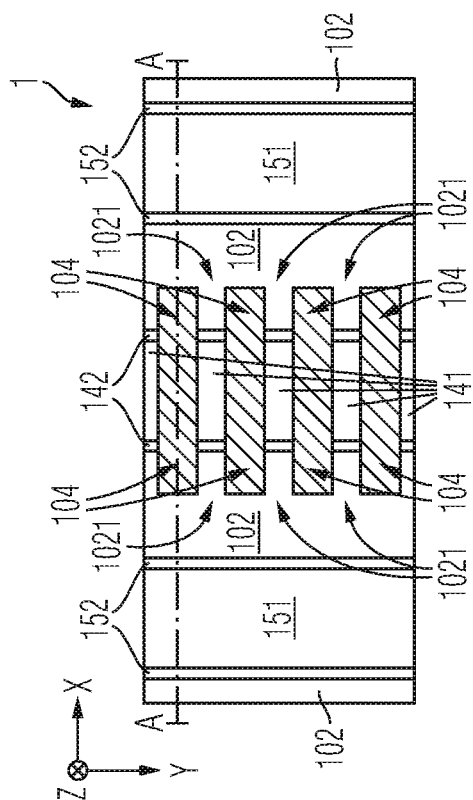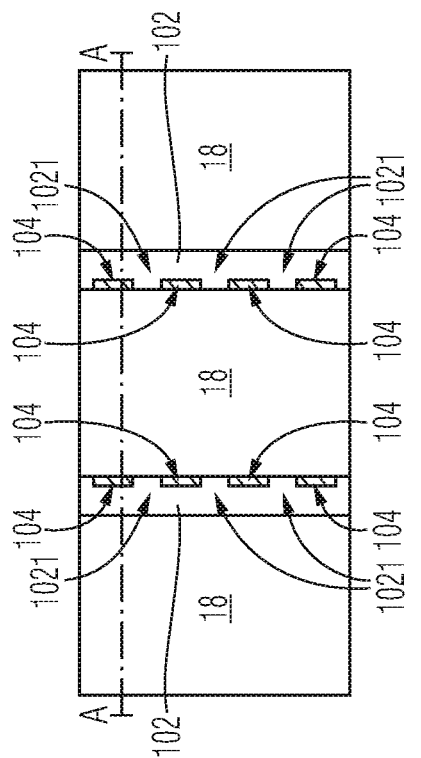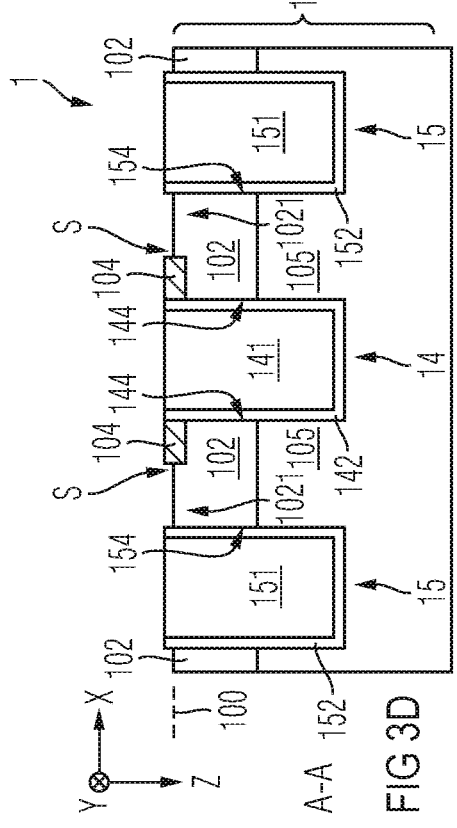
FIG 3D
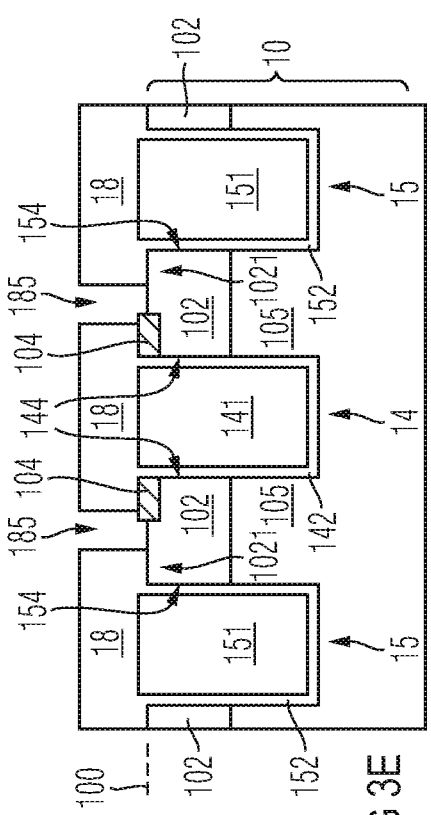
FIG 3E

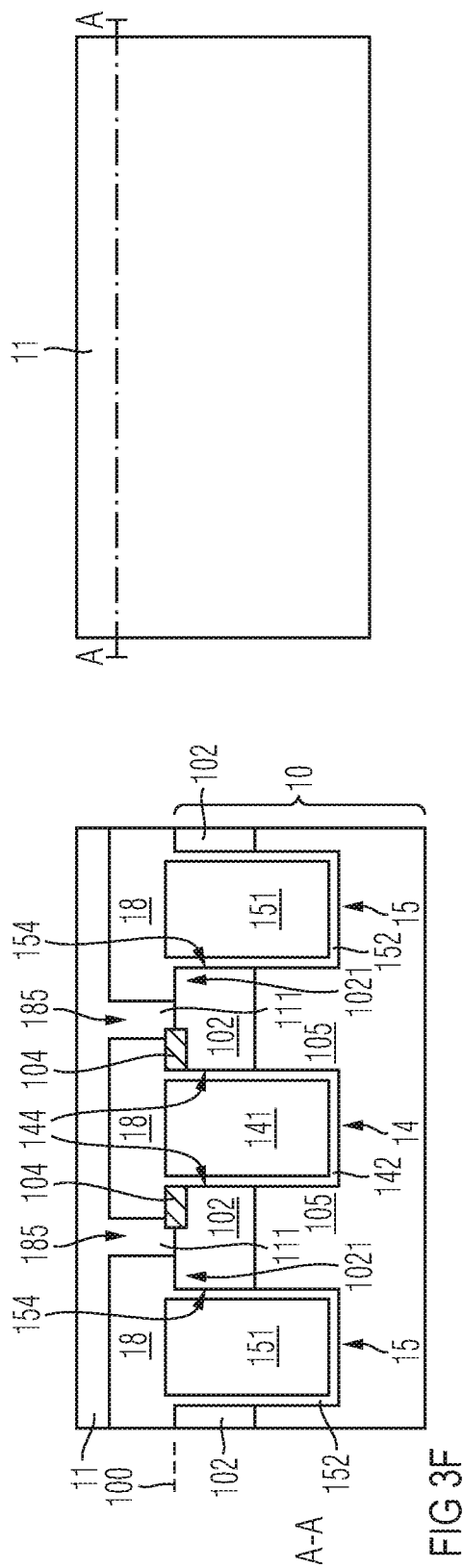

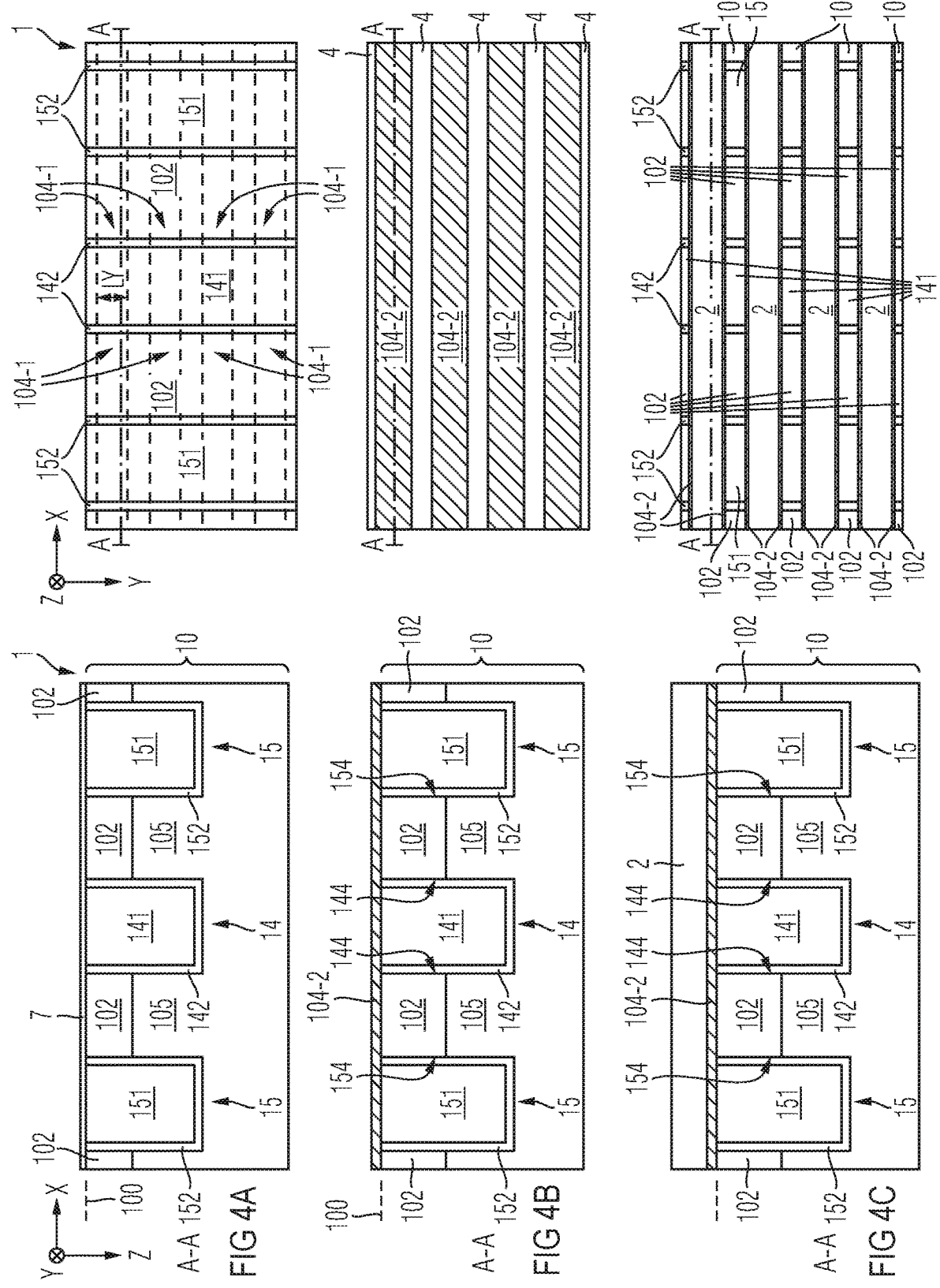

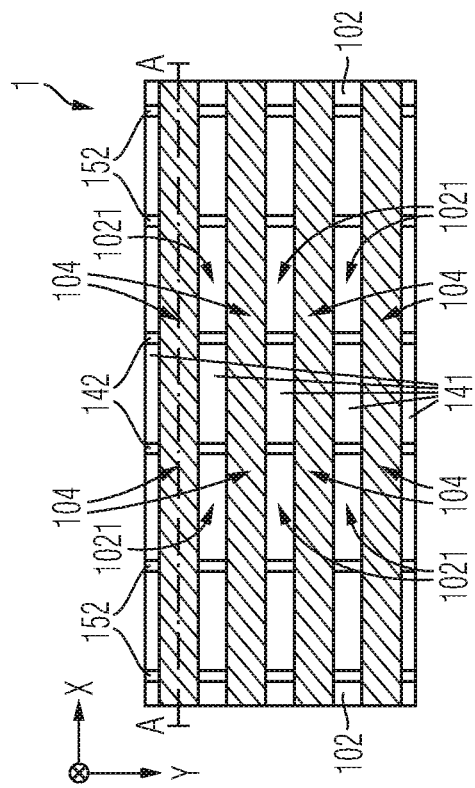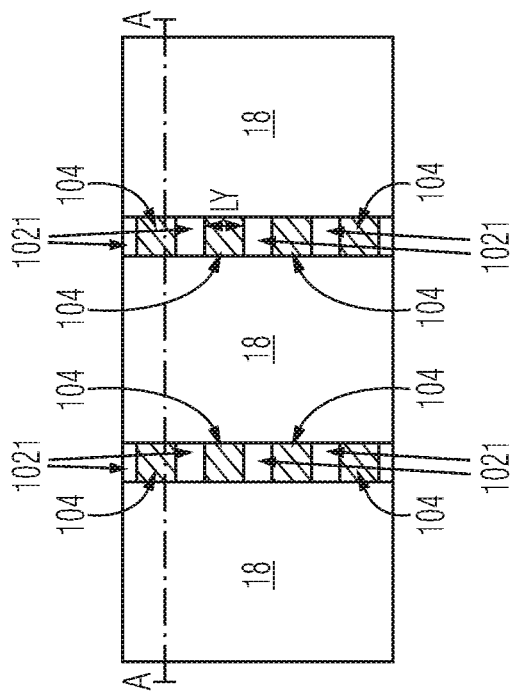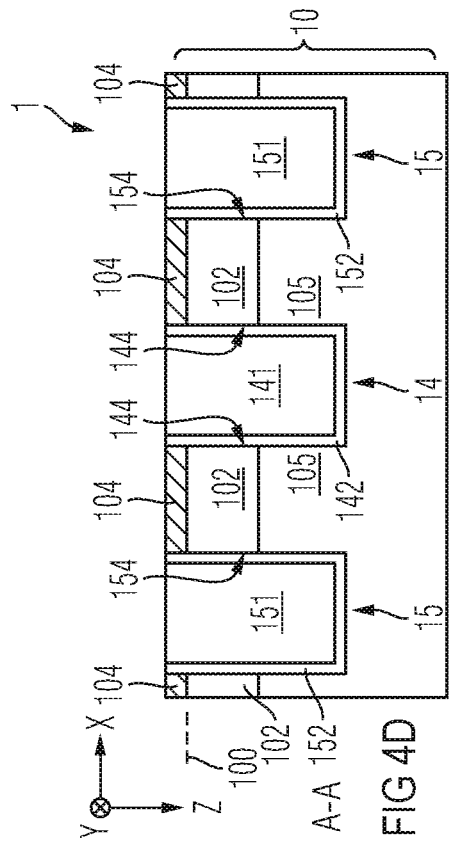
FIG 4D
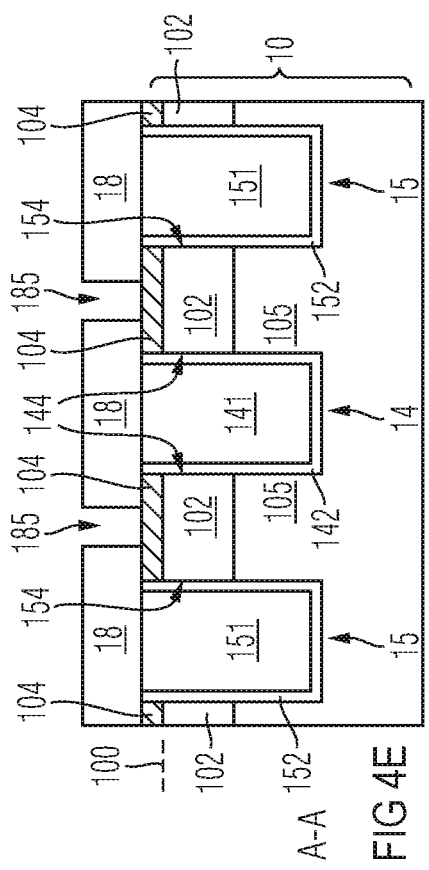
FIG 4E

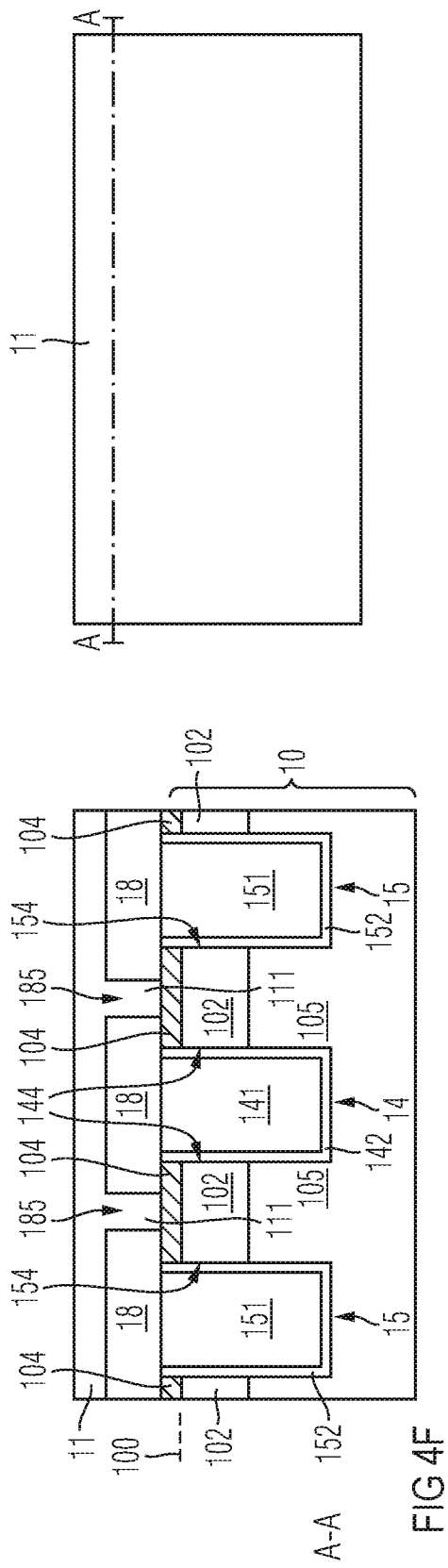

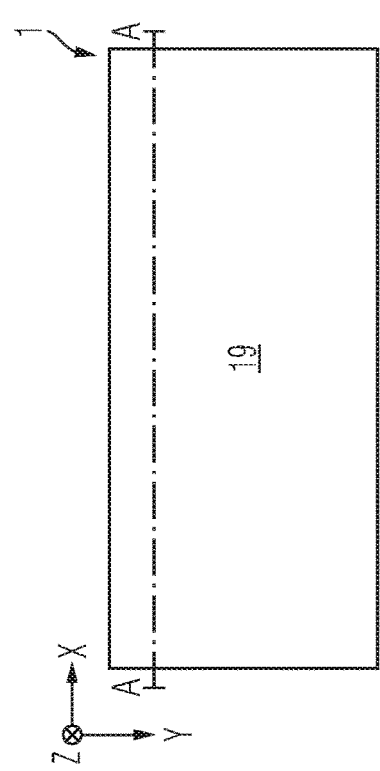
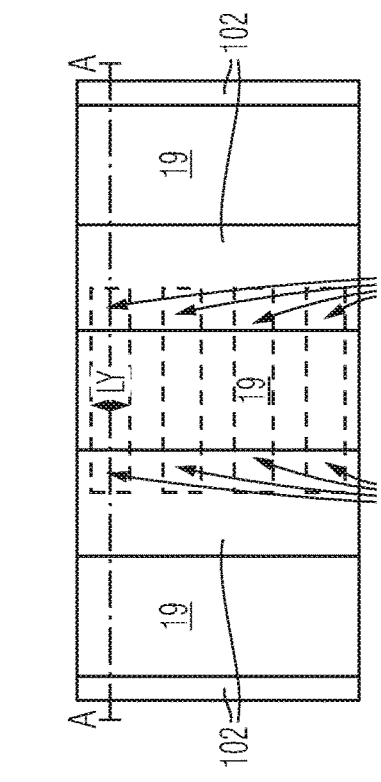
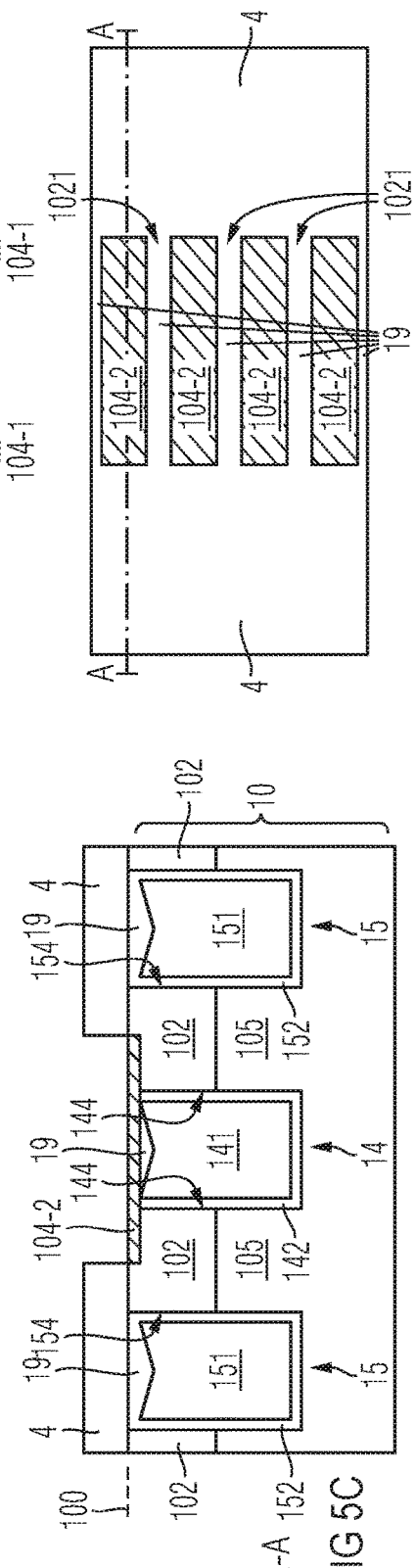
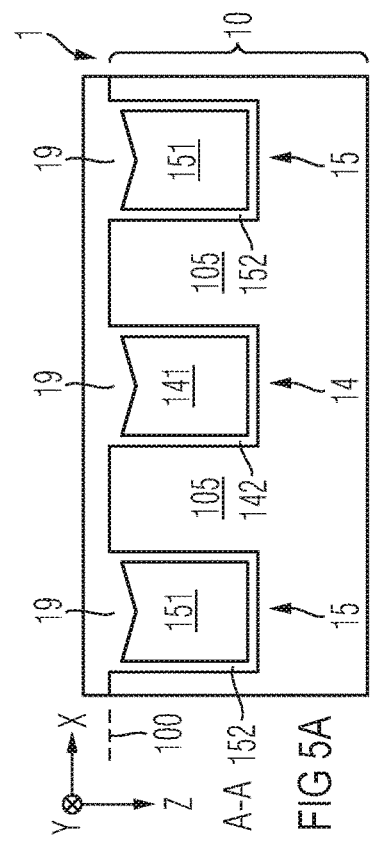
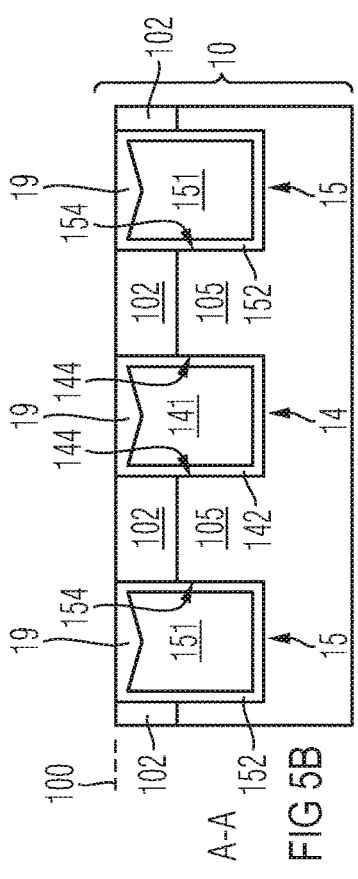
FIG 5A
FIG 5B
FIG 5C

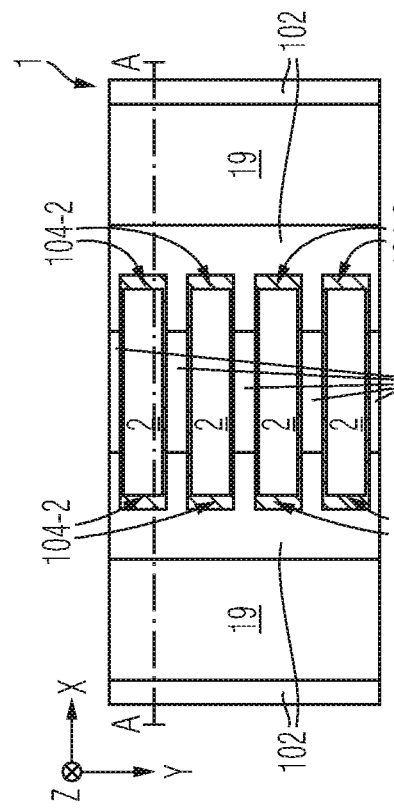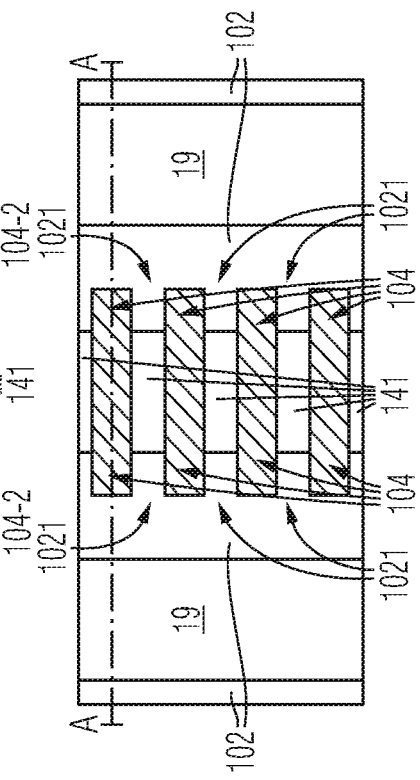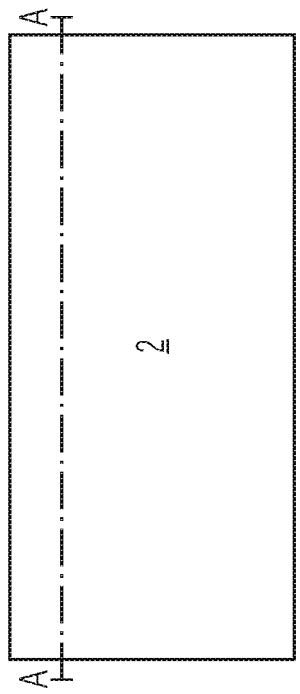
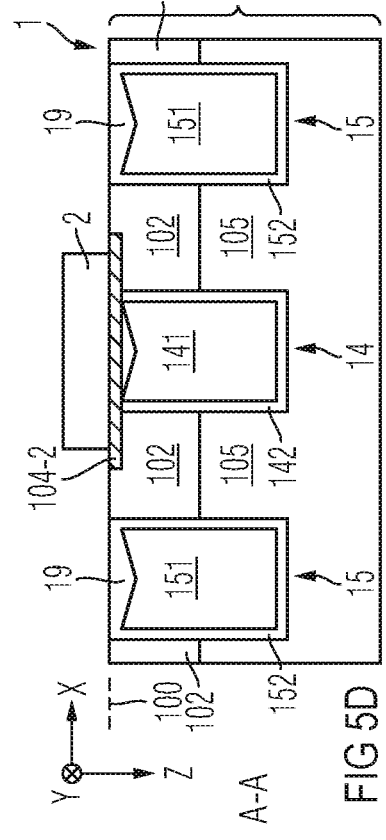
FIG 5D
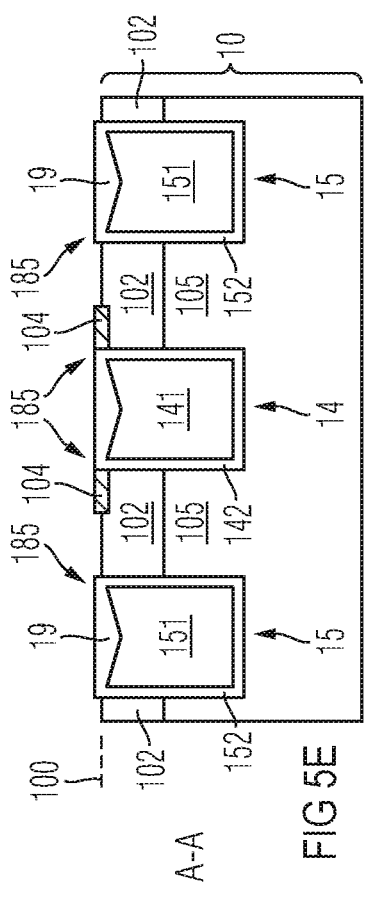
FIG 5E
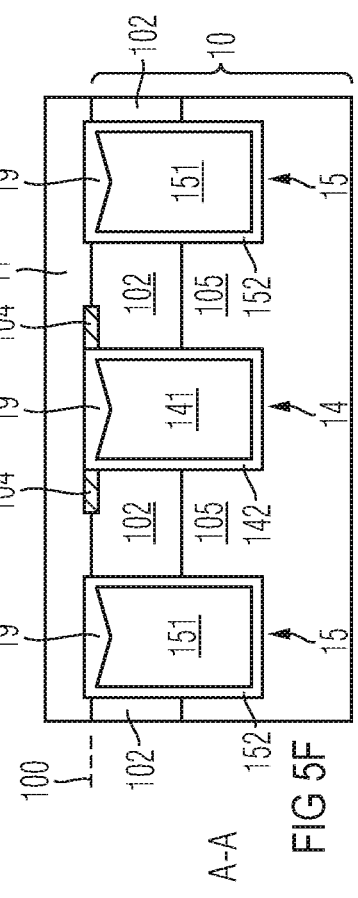
FIG 5F

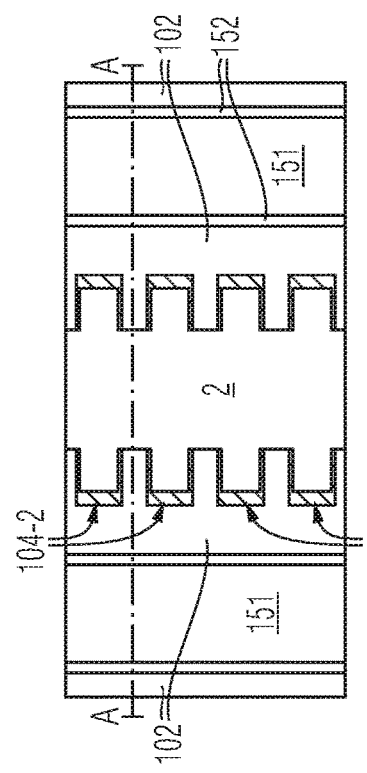
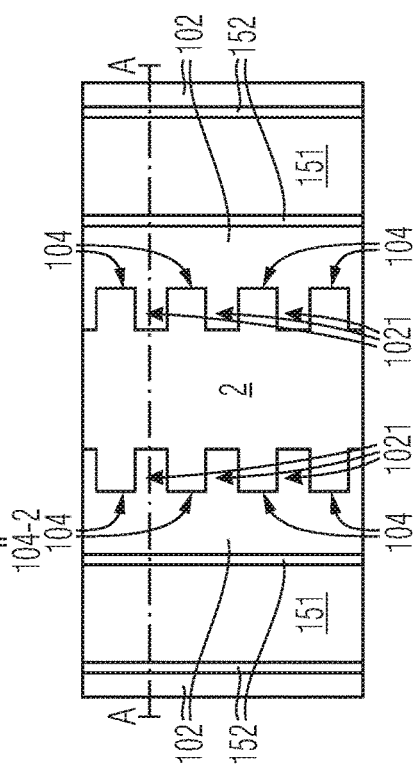
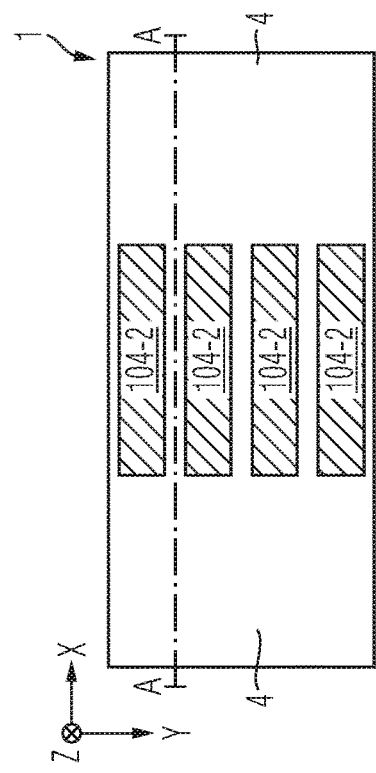
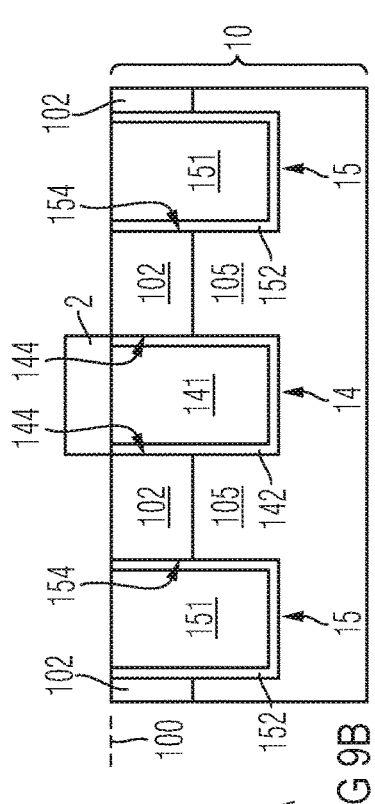
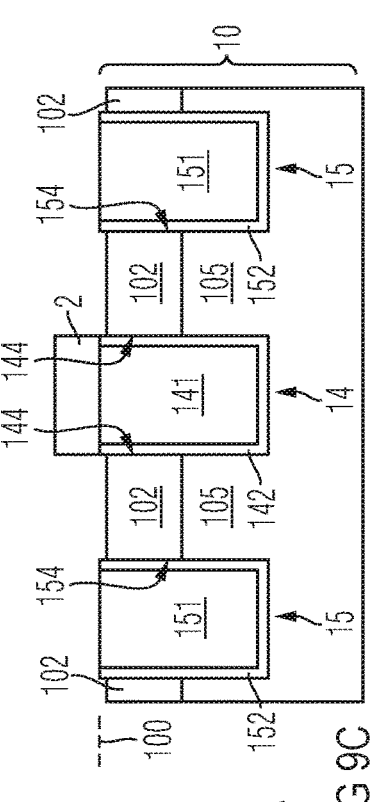
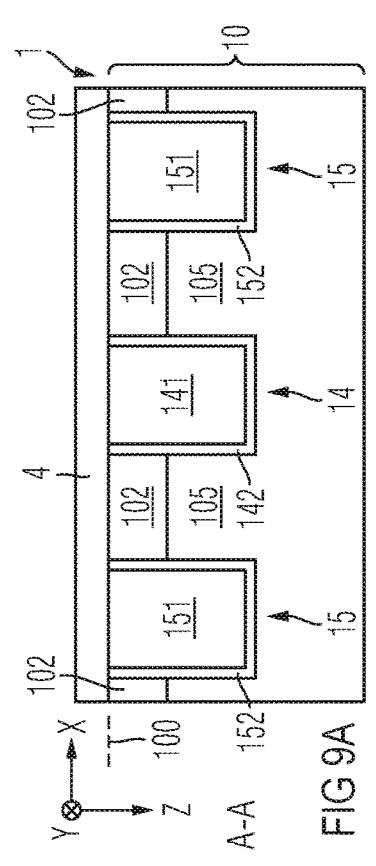
FIG 9A
FIG 9B
FIG 9C

METHOD OF FORMING A POWER SEMICONDUCTOR DEVICE

TECHNICAL FIELD

This specification refers to embodiments of a method of forming a power semiconductor device and to embodiments of a power semiconductor device. In particular, this specification refers to aspects of a formation process of elevated source regions of a power semiconductor device and to corresponding devices.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, in power semiconductor devices having a transistor configuration, the load current path may be controlled by means of an insulated control electrode, sometimes referred to as gate electrode. For example, upon receiving a corresponding control signal from, e.g., a driver unit, the control electrode may set the power semiconductor device in one of a conducting state and a blocking state by selectively opening or closing a conduction channel for the load current. The conduction channel is usually formed inside a body region adjacent to the insulated control electrode and connects a source region with a drift region which are separated by the body region. In some cases, the gate electrode may be included within a trench of the power semiconductor switch, wherein the trench may exhibit, e.g., a stripe configuration or a needle configuration.

It is generally desirable to ensure a high reliability of power semiconductor devices. For example, a certain ruggedness of power semiconductor transistors with regard to latch-up induced destruction needs to be provided. For example, it is thus desirable to provide a method of forming reliable source and/or body contact regions as well as corresponding power semiconductor devices.

SUMMARY

According to an embodiment, a method of forming a power semiconductor device comprises: providing a semiconductor body having a surface; providing a control electrode being arranged at least partially on or inside the semiconductor body and being configured to control a load current in the semiconductor body; forming a plurality of elevated source regions of a first conductivity type in the semiconductor body adjacent to the control electrode, wherein forming the elevated source regions comprises at least the steps of: implanting dopants of the first conductivity type into the semiconductor body; forming a recess mask layer on the semiconductor body surface, wherein the recess mask layer covers at least the areas of intended source regions; and removing portions of the semiconductor body that are uncovered by the recess mask layer by means of a first etch process to form the elevated source regions and recessed body regions adjacent to the elevated source regions, wherein the recessed body regions are arranged at least partially between the elevated source regions. The method further comprises: forming a dielectric layer on the semiconductor body surface; forming a contact hole mask layer on the dielectric layer; removing portions of the dielectric layer uncovered by the contact hole mask layer by means of a second etch process so as to form a contact hole; and filling the contact hole at least partially with a conductive material so as to establish an electrical contact with at least a portion of the elevated source regions and at least a portion of the recessed body regions.

It should be noted that, in some embodiments, the aforementioned steps involving the recess mask layer and the steps involving the contact hole mask layer may also be carried out in an inversed order, i.e., in some embodiments, the contact hole may be formed before the formation of the elevated source regions and recessed body regions by means of the first etch process.

According to another embodiment, a power semiconductor device is presented. The power semiconductor device comprises:
- a semiconductor body having a surface;
- a control electrode being arranged at least partially on or inside the semiconductor body and being configured to control a load current in the semiconductor body;
- a plurality of elevated source regions of a first conductivity type being arranged in the semiconductor body adjacent to the control electrode;
- a plurality of recessed body regions being arranged adjacent to the elevated source regions; and
- a dielectric layer being arranged on a portion of the semiconductor body surface and defining a contact hole, the contact hole being at least partially filled with a conductive material that establishes an electrical contact with at least a portion of the elevated source regions and at least a portion of the recessed body regions;

wherein at least one first contact surface between at least one of the elevated source regions and the dielectric layer extends in a first horizontal plane and at least one second contact surface between at least one of the recessed body regions and the dielectric layer extends essentially in a second horizontal plane, the second horizontal plane being located vertically below the first horizontal plane.

According to another embodiment, a power semiconductor device comprises:
- a semiconductor body having a surface;
- a control trench extending from the surface along a vertical direction into the semiconductor body;
- a control electrode being arranged at least partially inside the control trench and being configured to control a load current in the semiconductor body;
- at least two elevated source regions of a first conductivity type being arranged in the semiconductor body adjacent to the control electrode;
- a recessed body region of a second conductivity type being arranged adjacent to the elevated source regions and extending at least partially between the elevated source regions; and
- a conductive layer being arranged on top of the semiconductor body and establishing an electrical contact with at least a portion of the elevated source regions and with at least a portion of the recessed body region;

wherein at least one third contact surface between at least one of the elevated source regions and the conductive layer extends essentially in a third horizontal plane and a fourth contact surface between the recessed body region and the conductive layer extends essentially in a fourth horizontal plane, the fourth horizontal plane being located vertically below the third horizontal plane.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIGS. 1A-1F schematically and exemplarily illustrate stages of a semiconductor device processing method in accordance with one or more embodiments;

FIGS. 2A-2F schematically and exemplarily illustrate stages of a semiconductor device processing method in accordance with one or more embodiments;

FIGS. 3A-3F schematically and exemplarily illustrate stages of a semiconductor device processing method in accordance with one or more embodiments;

FIGS. 4A-4F schematically and exemplarily illustrate stages of a semiconductor device processing method in accordance with one or more embodiments;

FIGS. 5A-5F schematically and exemplarily illustrate stages of a semiconductor device processing method in accordance with one or more embodiments;

FIGS. 9A-9C schematically and exemplarily illustrate stages of a semiconductor device processing method in accordance with one or more embodiments.

DETAILED DESCRIPTION

Figure 1A:
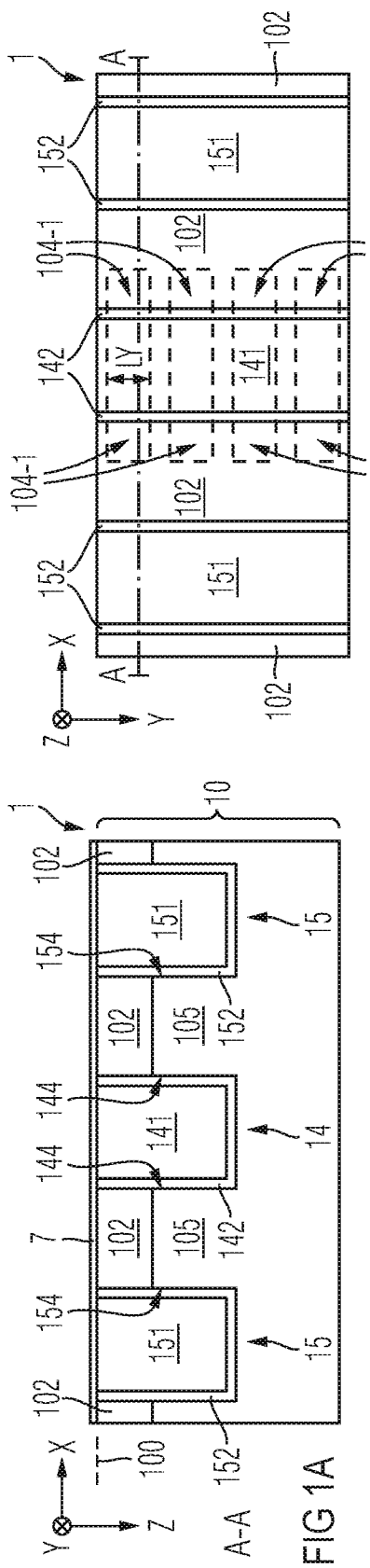

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor switch exhibiting a stripe cell or cellular cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, e.g., monolithically integrated cell of two anti-serially connected diodes, a monolithically integrated transistor cell, e.g., a monolithically integrated IGBT cell and/or derivatives thereof. Such diode/transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 500 V or even more, e.g., up even to at least 6 kV or more.

For example, the power semiconductor device described below may be a semiconductor device exhibiting a stripe cell configuration or a cellular (columnar/needle) cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIGS. 1A-1F schematically and exemplarily illustrate stages of a power semiconductor device processing method in accordance with one or more embodiments. In each of FIGS. 1A-1F, the left panel shows a section of a vertical cross-section of the power semiconductor device 1 to be produced at a respective processing stage, whereas the right panel shows a corresponding top view on the power semiconductor device 1.

As illustrated FIG. 1A, a semiconductor body 10 having a surface 100 is provided, e. g., in the form of a wafer. At the processing stage shown in FIG. 1A, the semiconductor body 10 may have already been subjected to several processing steps, which are in principle known to the person skilled person and will therefore not be described in detail here. For example, a plurality of trenches 14, 15 extending from the surface 100 into the semiconductor body 10 along the vertical direction Z may have been formed, e. g., by means of an etch process. Further, a respective trench insulation structure 142, 152, such as an oxide, may has been formed inside the trenches 14, 15 and the trenches 14, 15 have been filled with a conductive material, such as polysilicon, so as to form trench electrodes 141, 151.

In the present exemplary embodiment, a control trench 14 is provided, wherein the control trench 14 comprises a control electrode 141 (also referred to as gate electrode) that is configured for controlling a load current in the semiconductor body 10 in dependence on a control signal. For example, in the processed power semiconductor device 1, the control electrode 141 may be electrically connected with a control terminal structure (not illustrated) that is configured to receive the control signal from external of the power semiconductor device 1, as is in principle well known in the art.

Further, a source trench 15 is provided on each side of the control trench 14, such that two trench sidewalls 144, 154 facing each other of two adjacent ones of the trenches 14, 15 laterally confine a mesa region 105 of the semiconductor body 10 along a first lateral direction X. The source trenches 15 comprise in each case a source electrode 151. For example, in the processed power semiconductor device 1, the source electrodes 151 may be electrically connected with a first load terminal structure 11 (see, e. g., FIG. 6). For example, the first load terminal structure 11 may be a source terminal structure in case the power semiconductor device 1 is or comprises a MOSFET or an emitter terminal structure in case the power semiconductor device 1 is or comprises an IGBT.

It should be noted that FIG. 1A-1F show only a small section of the semiconductor body 10 and that, in fact, there may be provided a plurality of such control trenches 14 and/or source trenches 15, which may be arranged in various combinations and patterns (i.e. according to various so-called contacting schemes, which determine as to whether the electrodes 141, 151 are connected with the control terminal structure or with the first load terminal structure 11).

For example, in some embodiments, two trench sidewalls 144, 154 of respective neighboring control trenches 14 and/or source trenches 15 may be spaced apart from each other along the first lateral direction X by at most 5 µm, such as at most 2 µm, at most 1 µm, at most 600 nm or only at most 200 nm.

As further illustrated in FIG. 1A, one or more body regions 102 of the second conductivity type (e. g., p-type) may already have been formed in the semiconductor body 10, e. g., by means of a first implantation of dopants of the second conductivity type through the semiconductor body surface 100. For example, such a body implantation may be carried out as an unmasked plantation of dopants of the second conductivity type. Exemplary dopant atoms/molecules of the second conductivity type that may be suitable for body implantation include boron, aluminum, gallium, indium and compound molecules of these species. For example, boron difluoride ($BF_2$) or other boron-fluoride compounds (BF)) may be employed as dopants of the second conductivity type. An implantation dose for the body implantation may be chosen, for example, in the range from $1E11$ $cm^{-2}$ to $1E16$ $cm^{-2}$.

For example, the first implantation may have been carried out though a relatively thin stray oxide 7 arranged on the surface (see FIG. 1A), as is in principle known in the art. In the right panel of FIG. 1A, the stray oxide 7 is not shown.

In the present exemplary embodiment, a respective body region 102 is formed in each mesa region 105, wherein the body region 102 laterally extends throughout the entire mesa region 105. For example, the first implantation of dopants of the second conductivity type may have been followed by a diffusion step (e.g. at an elevated temperature) so as to extend the body regions 102 from the surface 100 further into the semiconductor body 10. For example, this may result in body regions 102 extending from the surface 100 along the vertical direction Z down to a diffusion depth in the range from 0.4 µm to 3 µm.

It should be noted that the formation of the body regions 102 as described above may also be effected at a later processing stage.

In the right panel of FIG. 1A, the dashed lines mark areas 104-1 of intended source regions. In other words, it is intended that regions of the first conductivity type, which may function as source regions 104 of the power semiconductor device 1, shall be formed in particular in the portions that lie within the mesa regions 105 in areas confined by the dashed lines and the trench sidewalls 144 of the control trench 14.

As illustrated, in a top view on the semiconductor body surface 100, the areas 104-1 of the intended source regions may be distributed along the control trench 14, e.g., according to a regular pattern. Further, said areas 104-1 may be spaced apart from each other along a main lateral extension direction of the control trench 14, which is in the present embodiment the second lateral direction Y.

In the exemplary embodiment illustrated in FIG. 1A, the areas 104-1 of the intended source regions comprise a plurality of island-shaped source regions, which cover only a part of the mesas 105. For example, the island-shaped source regions may be essentially rectangular, as depicted in FIG. 1A, wherein it should be understood that the corners of the rectangular islands may be rounded to some degree during the subsequent processing. In other embodiments, the areas 104-1 of the intended source regions may instead take the form of, e. g., rectangular source stripes extending continuously through a plurality of mesa regions 105, wherein, again, corners of the rectangular source stripes may be rounded to some degree during the subsequent processing. This will be explained in more detail further below with reference to FIG. 4A-4F.

In an embodiment, an extension LY of the areas 104-1 of the intended source regions along the main lateral extension direction Y of the control trench 14 may amount to at most 5 μm, such as at most 2 μm, or even only at most 1 μm. For example, said extension LY is measured at the trench sidewall 144, i.e., at a position where the respective area 104-1 is in contact with the control trench 14.

In the following, the process of forming a plurality of elevated source regions 104 in said areas 104-1 of intended source regions will be explained with reference to FIGS. 1B-1F.

Figure 1B:
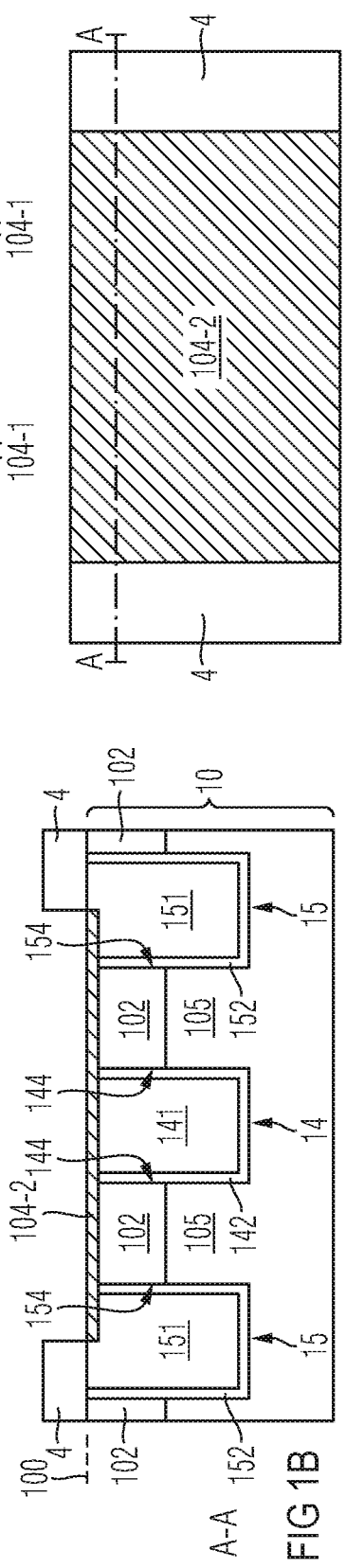

The left panel of FIG. 1B schematically illustrates the formation of a source implant region 104-2 in the semiconductor body 10. To this end, an implant mask layer 4 may be arranged at the semiconductor body surface 100. For example, the implant mask layer 4 is or comprises a structured resist layer.

Then, dopants of the first conductivity type (e. g., n-type) may be implanted in the semiconductor body 10 in areas where the implant mask layer 4 exposes the semiconductor body surface 100. For example, the implant mask layer 4 exposes at least the areas 104-1 of intended source regions 104. In accordance with the present exemplary embodiment, the implant mask layer 4 may expose a relatively large connected surface (comprising several trenches 14, 15 and mesa regions 105). In other embodiments, as will be further explained below with reference to, e.g., FIG. 2B, the implant mask layer 4 may have a plurality of smaller opening, which comprise the areas 104-1 of the intended source regions.

Exemplary dopant atoms of the first conductivity type that may be suitable for this source implantation step include arsenic, phosphorous, antimony, selenium, and hydrogen. For example, the source implantation may be carried out at a dopant dose or at multiple dopant doses in the range from $1E13\ cm^{-2}$ to $1E17\ cm^{-2}$, such as, e. g., at a single dose of $6E15\ cm^{-2}$ or $8E15\ cm^{-2}$. Further, a relatively low implantation energy may be applied, such as an implantation energy in the range from 1 keV to 100 keV, e. g., 30 keV. For example, the stray oxide mentioned above may still be arranged on the semiconductor body surface 100 during the source implantation and may only be removed afterwards.

The right panel of FIG. 1B shows a top view of the semiconductor surface 100 after the source implantation step and before resist strip, i.e., before removal of the implant mask layer 4. Thus, FIG. 1B shows a relatively large connected source implant region 104-2 extending in both mesa regions 105, which are still covered by the mask layer 104. In FIG. 1B as well as the following Figures, hatched areas mark regions comprising dopants of the first conductivity that have been implanted in the source implantation step.

Figure 1C:
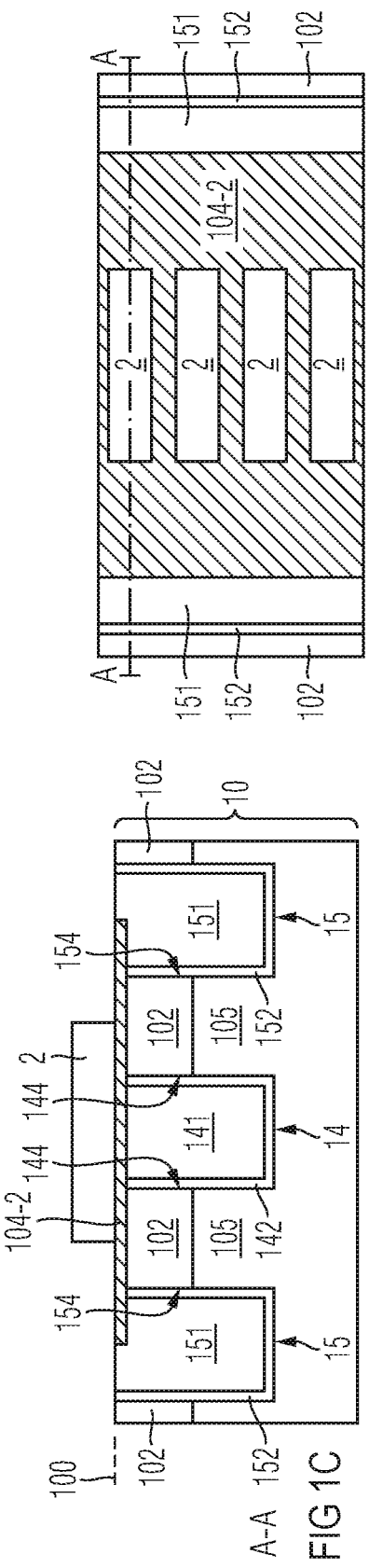

As a next process step, FIG. 1C illustrates the formation of a recess mask layer 2 on the semiconductor body surface 100 after removal of the implant mask layer 4. The recess mask layer 2 may be provided, e. g., in the form of a structured resist layer 2, which may cover at least the areas 104-1 of intended source regions (cf. right panel of FIG. 1C).

Then, portions of the semiconductor body 10 that are uncovered by the recess mask layer 2 may be removed by means of a first etch process, thereby forming inside the mesa regions 105 a plurality of elevated source regions 104 and recessed body regions 1021 adjacent to the elevated source regions 104, wherein the recessed body regions 1021 are arranged at least partially between the elevated source regions 104 (see right panel of FIG. 1D). In other words, when moving from one elevated source region 104 to a neighboring elevated source region 104 (being arranged adjacent to the same trench 14), one passes through a recessed body region 1021. The elevated source regions 104 adjoin the trench sidewalls 144 of the control trench 14. The recessed body regions 1021 are included in the body region 102. Thus, the recess mask layer 2 defines lateral positions and lateral extensions of intended source regions 104-1 (e.g., in the form of a regular source region pattern as illustrated in the right panel of FIG. 1A), and portions of the source implant regions 104-2 that laterally extend beyond the areas 104-1 of intended source regions are then removed during the first etch process. In other words, some portions of the semiconductor body 10 are "sacrificed" for the formation the elevated source regions 104. The first etch process may therefore also be referred to as a "sacrificial etch process."

The result of this first etch process is schematically shown in FIG. 1D, wherein the recess mask layer 2 has already been removed i.e., a resist strip has been effected. For example, as a result of the first etch process, at a lateral transition between each elevated source region 104 and an adjacent recessed body region 1021, the semiconductor surface 100 may exhibit a step S (see also FIG. 6). For example, a cross-section of the step S may be essentially vertical, as schematically illustrated in each of FIGS. 1D and 6. In other embodiments, the cross-section of the step may be less steep and may, for example, be tilted with respect to the vertical direction Z. The steps S as shown, e.g., in the left panel of FIG. 1D and in FIG. 6, extend in parallel to the second lateral direction Y, i.e., along the main lateral extension direction Y of the trenches 14, 15. However, it should be noted that similar steps may also be formed at lateral transitions between the elevated source regions 104 and the portions of the adjacent recessed body regions 1021 that extend between the elevated source regions 104 (not visible in FIGS. 1D and 6). Correspondingly, such steps may not run parallel, but e.g. essentially orthogonal to the main lateral extension direction Y of the trenches 14, 15. For example, such steps may extend essentially along the first lateral direction X.

Put differently, the first etch process may result in at least two different mesa heights of the mesa region 105, wherein the elevated source regions 104 are located in portions of the mesa 105 having a higher mesa height as compared to the adjacent recessed body regions 1021. Further details of the lateral transition between the elevated source regions 104 and the adjacent recessed body regions 1021 will be described further below with reference to FIG. 6.

In an embodiment, the first etch process is carried out in such a way that the portions of the semiconductor body 10 that are uncovered by the recess mask layer 2 are etched away at least down to an etching depth that corresponds to a projected range of the source implantation. In this context, it should be noted that said portions of the source implant regions 104-2 need not necessarily be completely removed during the first etch process. Instead, it may be sufficient if said portions are mostly removed, i.e. at least up to some residual end-of-range dopant concentration that may be located below the projected range of the source implantation. For example, in an embodiment, such residual end-of-range dopants of the first conductivity type may be over-doped by means of a second implantation of dopants of the second conductivity type later on. This will be explained in more detail below.

For example, in an embodiment, the portions of the semiconductor body 10 that are uncovered by the recess mask layer 2 are etched away at least down to an etching depth of at least 10 nm, such as at least 25 nm, 50 nm, or even at least 250 nm below the semiconductor body surface 100.

For example, the first etch process may be an anisotropic etch process which may be directed substantially along the vertical direction Z. In another embodiment, the first etch process may be carried out as an isotropic etch process.

In accordance with an embodiment, a temperature annealing step may be carried out after the first etch process. It should be noted that one or more further steps, such as a deposition of a glass, may be carried out between the first etch process and the temperature annealing step. For example, the temperature annealing step may be carried out at a temperature in the range from 800° C. to 1100° C. and for a duration the range from 1 second to several hours, such as, e. g., 4 hours. As a result of the temperature step, the implanted dopants of the first conductivity type may diffuse further into the semiconductor body 10, yielding a larger vertical extension of the elevated source regions 104. For example, the vertical extension of the elevated source regions 104 after the temperature annealing step may be larger than the step S, as schematically illustrated, e. g., in each of FIGS. 1D and 6.

As mentioned previously, said first implantation of dopants of the second conductivity type by which the body regions 102 are formed may also be carried out at a later processing stage, i.e., for example, after the source implantation and even after the first etch process. However, in an embodiment, the formation of the body regions 102 by means of said first implantation of dopants of the second conductivity type is carried out (at the latest) before a temperature annealing step for elevated source regions 104 as described above is affected.

Further, in an embodiment, a second implantation of dopants of the second conductivity type may be carried out after the first etch process. For example, dopants of the second conductivity type may thus be implanted at least into a portion of the recessed body regions 1021. In an embodiment, during said second implantation step, dopants of the second conductivity type are implanted at least in the portion of the semiconductor body 10 that is uncovered by the recess mask layer 2, i.e., the second implantation step may be performed before the recess mask 2 is stripped. Alternatively, the second implantation may be carried out after removal of the recess mask 2.

For example, potential residual dopants of the first conductivity type, which may stem from the source implantation step, may be over-doped by means of the second implantation of dopants of the second conductivity type. For example, some residual end-of-range dopant concentration may be located below the projected range of the source implantation, as mentioned above. Correspondingly, a relatively low dopant dose, such as, e. g., in the range from 1E13 $cm^{-2}$ to 5E15 $cm^{-2}$ may be sufficient for over-doping the residual dopants of the first conductivity type by means of the second implantation of dopants of the second conductivity type. For example, in an embodiment, Boron atoms or $BF_2$ molecules may be implanted, e. g., at a dose of 1E15 $cm^{-2}$ during said second implantation step. For example, an implantation energy in the range from 1 keV to 100 keV, such as, e. g., 5 keV may be applied. Further, the second implantation of dopants of the second conductivity type may be carried out without a stray oxide being arranged on the semiconductor surface 100. In an embodiment, the second implantation of dopants of the second conductivity type is carried out after the first etch process and before the temperature annealing step mentioned above.

With reference to FIG. 1E, as a further processing step, a dielectric layer 18, such as an oxide layer, may be formed on the semiconductor body surface 100. For example, in an embodiment, the dielectric layer 18 may cover at least the elevated source regions 104 and the recessed body regions 1021.

A contact hole mask layer may then be formed on the dielectric layer 18 (not illustrated). The contact hole mask layer may be structured so as to define the contact hole areas, e.g., above one or more of the mesa regions 105.

Then, portions of the dielectric layer 18 that are uncovered by the contact hole mask layer may be removed by means of a second etch process so as to form at least one contact hole 185. For example, in an embodiment, a plurality of contact holes 185, such as at least one contact hole 185 per active mesa 105, may thus be formed. The result of this second etch process is schematically illustrated in FIG. 1E. For example, in an embodiment in accordance with FIG. 1E, the contact holes 185 may expose at least a portion of the elevated source regions 104 and at least a portion of the recessed body regions 1021. In another embodiment, as will be explained in detail further below with reference to FIG. 5F, there may be provided one large contact hole that exposes a plurality of mesa regions 105, such as the entirety of an active cell field of the power semiconductor device 1.

FIG. 1F shows a processing stage after filling of the contact 185 holes with a conductive material 111, such as a metal. The conductive material 111 establishes an electrical contact with a portion of the elevated source regions 104 and a portion of the recessed body regions 1021. For example, the conductive material 111 filling the contact holes 185 may form a part of the first load terminal structure 11, such as, e.g., a front side metallization, of the power semiconductor device 1.

FIGS. 2A-2F schematically illustrate processing stages of a variant of the power semiconductor device formation method explained above with reference to FIGS. 1A-1F. Differences arise with regard to the implant mask layer 4 that is used for the source implantation. As schematically illustrated in FIG. 2B, in this embodiment, the implant mask layer 4 exposes at least the areas 104-1 of intended source regions, but covers at least a portion the semiconductor body 10, namely such portions where the recessed body regions 1021 shall be formed. The implant mask layer 4 has a plurality of openings, which comprise the areas 104-1 of the intended source regions. In the present exemplary embodiment, the openings have an island shape (e.g., an essentially rectangular shape, optionally with rounded corners) and are slightly larger than the areas 104-1 of the intended source regions. As a consequence, a plurality of rectangular source implant regions 104-2 that are slightly larger than the areas 104-1 of the intended source regions are formed, as shown in the right panel of FIG. 2B. In another embodiment, which is not illustrated in the Figures, the openings in the implant mask layer 4 may be slightly smaller than the areas 104-1 of the intended source regions. The subsequent processing steps as illustrated in FIGS. 2C-2F are entirely analogous to what has been explained above with reference to FIGS. 1C-1F.

FIGS. 3A-3F schematically illustrate a further variant of the power semiconductor formation method, wherein the implant mask layer 4 that is used for the source implantation has a plurality of openings in the form of rectangular stripes extending in each case above several trenches 14, 15 and mesa regions 15, see FIG. 3B. The subsequent processing steps as illustrated in FIGS. 3C-3F are entirely analogous to what has been explained above with reference to FIGS. 1C-1F.

FIGS. 4A-4F schematically illustrate yet another variant of the power semiconductor formation method. As illustrated in FIG. 4B, the present exemplary embodiment uses a source implantation mask layer 4 that is similar or identical to the one of FIG. 3B. However, differences arise with regards to the areas 104-1 of the intended source regions. As shown in FIG. 4A (right panel), the areas 104-1 of the intended source regions may instead take the form of rectangular source stripes extending continuously through a plurality of mesa regions 105. For example, the intended rectangular source stripes may be oriented transversely (such as, e.g., orthogonal) to the trenches 14, 15 and the mesas 105, as illustrated. As illustrated in FIG. 4C, also the recess mask layer 2 comprises a plurality of such extended stripes corresponding to the areas 104-1 of intended source regions. The further processing steps as illustrated in FIGS. 4D-4F are entirely analogous to what has been explained above with reference to FIGS. 1D-1F.

FIGS. 5A-5F schematically and exemplarily illustrate stages of a further semiconductor device processing method in accordance with one or more embodiments.

In the beginning, as illustrated in FIG. 5A and similar to what has been explained above with reference to FIG. 1A, a plurality of trenches 14, 15 extending from the surface 100 into the semiconductor body 10 along the vertical direction Z is formed, e. g., by means of an etch process. Further, a respective trench insulation structure 142, 152, such as an oxide, may has been formed inside the trenches 14, 15 and the trenches 14, 15 have been filled with a conductive material, such as polysilicon, so as to form trench electrodes 141, 151.

Further, in this exemplary embodiment, insulating cover layers 19 (or cap layers 19) are provided at least partially inside the trenches 14, 15 so as to close the trenches 14, 15 at the top. The insulating cover layer 19 may be formed, e.g., by depositing oxide on top of the trench electrodes 141, 151 close to the semiconductor surface, as illustrated in FIG. 5A. For example, a portion of the deposited oxide may be removed by of a chemical mechanical polishing (CMP) process. For example, the CMP process may be carried out so as to remove the deposited oxide down to the semiconductor surface 100.

The left panel of FIG. 5B schematically illustrates a process stage after such a CMP processing step and after body conditioning, wherein the body implantation may have been carried out as explained above with reference to FIG. 1A. The right panel of FIG. 5B indicates the areas 104-1 of intended source regions, which are (except for the presence of the insulating cover layers 19) similar to, e.g., the areas 104-1 of intended source regions depicted in FIG. 2B.

The further processing steps leading to the respective processing stages illustrated in FIGS. 5C-5E are analogous to the ones of FIGS. 1B-1D. Insofar it is referred to the above detailed explanations.

One difference arises, however, with regard to the contact hole formation. In the present embodiment, one large contact hole 185 that exposes a plurality of entire mesa regions 105, such as the entirety of an active cell field of the power semiconductor device 1, may be formed, e. g., by forming a dielectric layer and then removing a large portion of the dielectric layer above the active cell field. For example, only a peripheral portion of the dielectric layer, such as a portion located inside an edge termination region, may thus be left over (not illustrated) and define the extended contact hole 185.

FIG. 5F thus illustrates that, as a result of filling the contact hole 185 with a conductive material, a conductive layer 1111 (such as, e. g, a front metallization layer) is arranged on top of the mesa regions 105 and establishes an electrical contact with the elevated source regions 104 and the recessed body regions 1021. Further details in this regard will be explained below with reference to FIG. 8.

Figure 6:
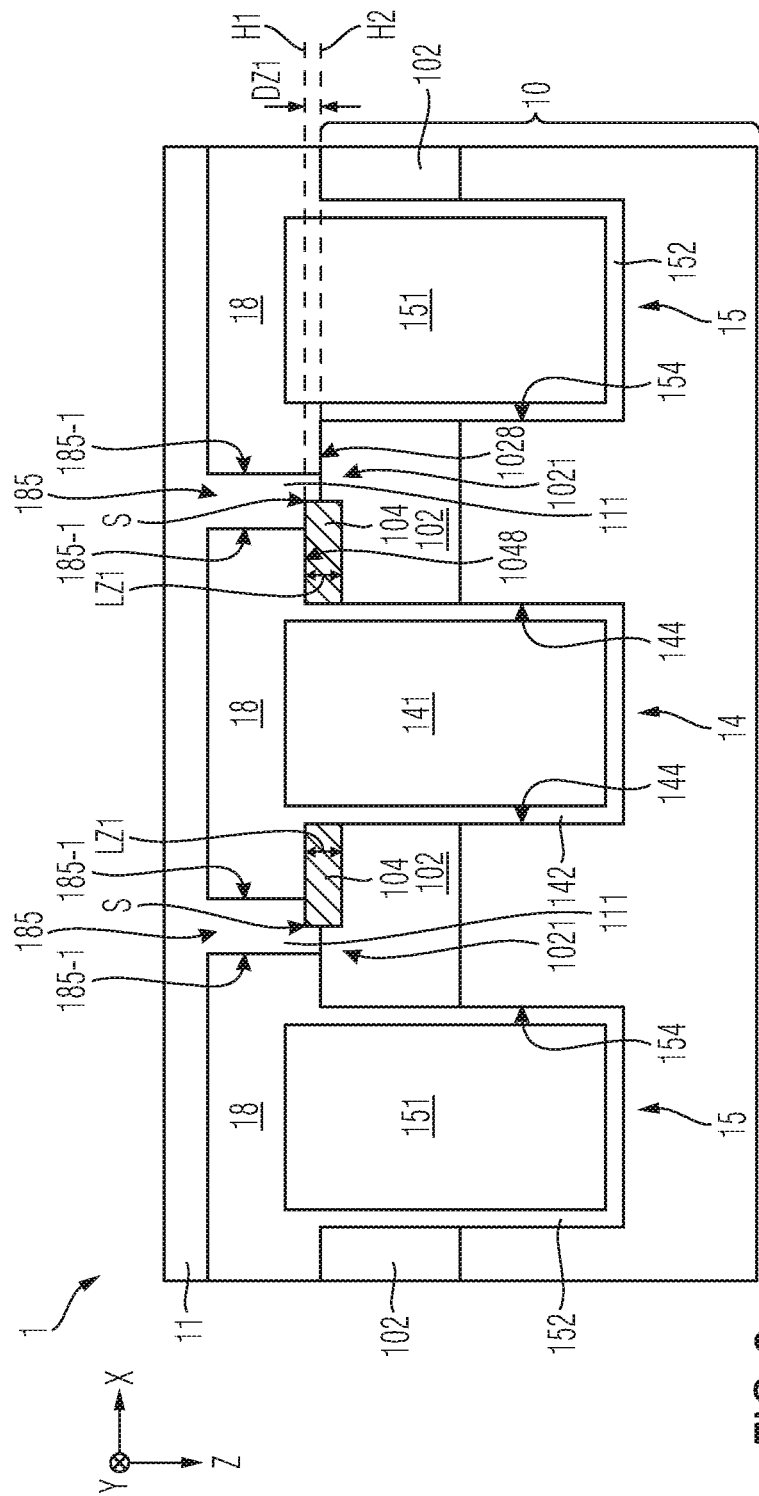
FIG. 6 schematically and exemplarily illustrates a section of a vertical cross-section of a power semiconductor device in accordance with one or more embodiments.

FIG. 6 schematically and exemplarily illustrates a section of a vertical cross-section of a power semiconductor device 1 in accordance with one or more embodiments. For example, the power semiconductor device 1 of FIG. 6 may have been produced by the method that has been explained above with reference to, e. g., FIGS. 1A-1F. In fact, FIG. 6 is an enlarged view of FIG. 1F.

The power semiconductor device 1 of FIG. 6 has a vertical power transistor configuration. For example, the power semiconductor device 1 may be or comprise at least one of an IGBT and a MOSFET. FIG. 6 depicts only a portion of the power semiconductor device 1 close to its front side comprising two control cells, wherein the control electrode 141 is arranged in the control trench 14. Further, two source trenches 15 are provided adjacent to the control trench 14.

A plurality of elevated source regions 104 of the first conductivity type are arranged in the semiconductor body 10 adjacent to the control electrode 141, as has been explained above with regard to the formation method. Further, as has also been explained above, a plurality of recessed body regions 1021 are arranged adjacent to the elevated source regions 104.

The dielectric layer 18 is arranged on a portion of the semiconductor body surface 100 and defines contact holes 185 that are filled with a conductive material 111 that establishes an electrical contact with the elevated source regions 104 and with the recessed body regions 1021.

As shown in FIG. 6, a first contact surface 1048 between the elevated source regions 104 and the dielectric layer 18 extends in a first horizontal plane H1. Further, a second contact surface 1028 between the recessed body regions 1021 and the dielectric layer 18 extends essentially in a second horizontal plane H2, wherein the second horizontal plane H2 is located vertically below the first horizontal plane H1. For example, the mesa 105 may thus exhibit at least two different mesa heights, which may be, for example, due to the first etch process referred to above.

For example, a first vertical distance DZ1 between the first horizontal plane H1 and the second horizontal plane H2 amounts to at least 10 nm, such as at least 25 nm, at least 50 nm, or even at least 250 nm. Additionally or alternatively, the first vertical distance DZ1 may be smaller than a first vertical extension LZ1 of the respective elevated source region 104 having said contact surface 1048 with the dielectric layer 18.

As further illustrated in FIG. 6, in some embodiments, the semiconductor body surface 100 may exhibit an essentially vertical step S at a lateral transition between each elevated source region 104 and an adjacent recessed body region 1021, wherein the step S may be laterally spaced apart from lateral boundaries 185-1 of the contact hole 185. For example, the step S results from the first etch process explained above.

Figure 7A:
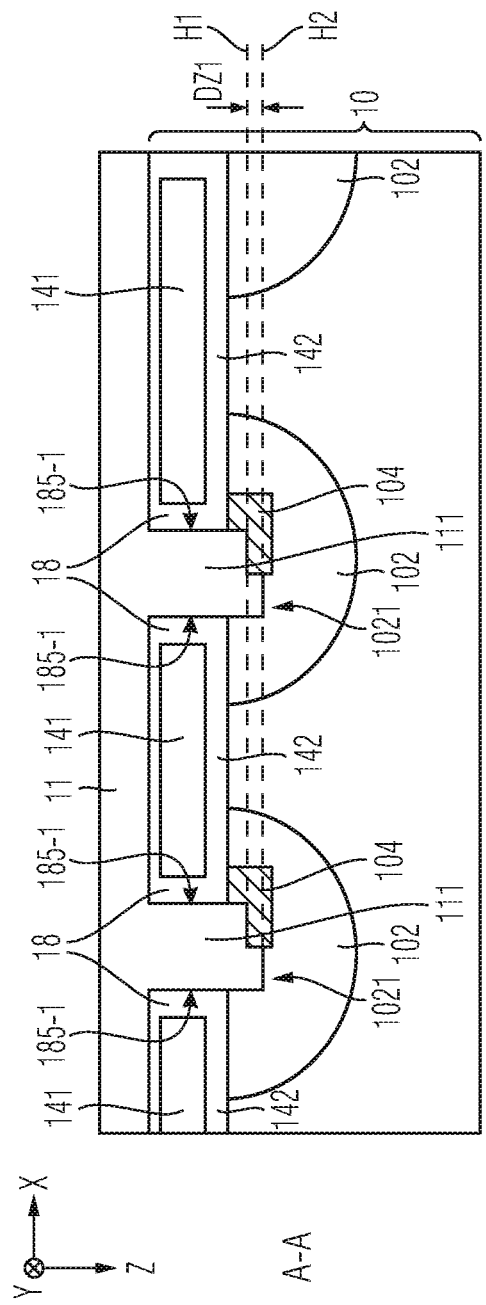
FIG. 7A schematically and exemplarily illustrates a section of a vertical cross-section of a power semiconductor device in accordance with one or more embodiments.
Figure 7B:
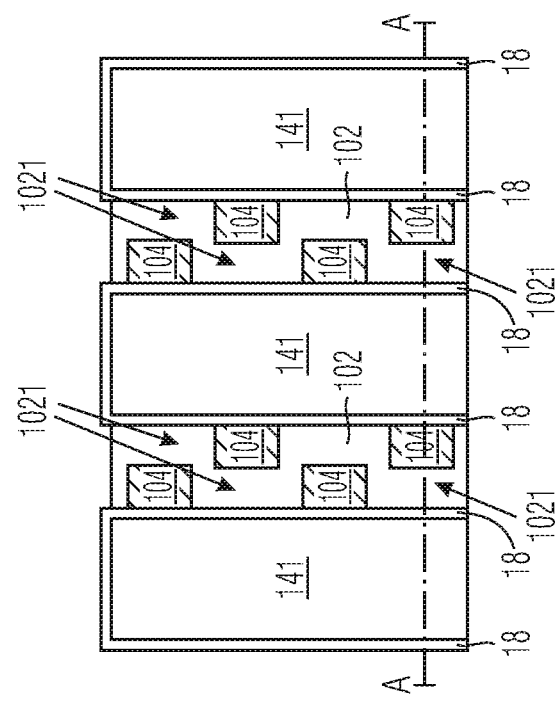
FIG. 7B schematically and exemplarily illustrates a section of a horizontal cross-section of a power semiconductor device in accordance with the embodiment of FIG. 7A.

FIGS. 7A-B illustrate another exemplary embodiment of a power semiconductor device 1 that may have come into being by means of a formation method according to the present invention. In contrast to the embodiments referred to in the above, the power semiconductor device 1 comprises vertical power transistor cells each having a planar control electrode 141, as can be best seen in the vertical cross-section view of FIG. 7A.

What has been explained above with regard to the formation of elevated source regions 104 and recessed body regions 1021 arranged there between in embodiments having trench cells analogously applies to the present exemplary embodiment with planar control electrodes 141. The horizontal cross-section in FIG. 7B illustrates an exemplary arrangement of the elevated source regions 104 inside the semiconductor body 10. For example, the elevated source regions may be staggered along a main lateral extension direction Y of the planar control electrodes 141, as depicted.

Figure 8:
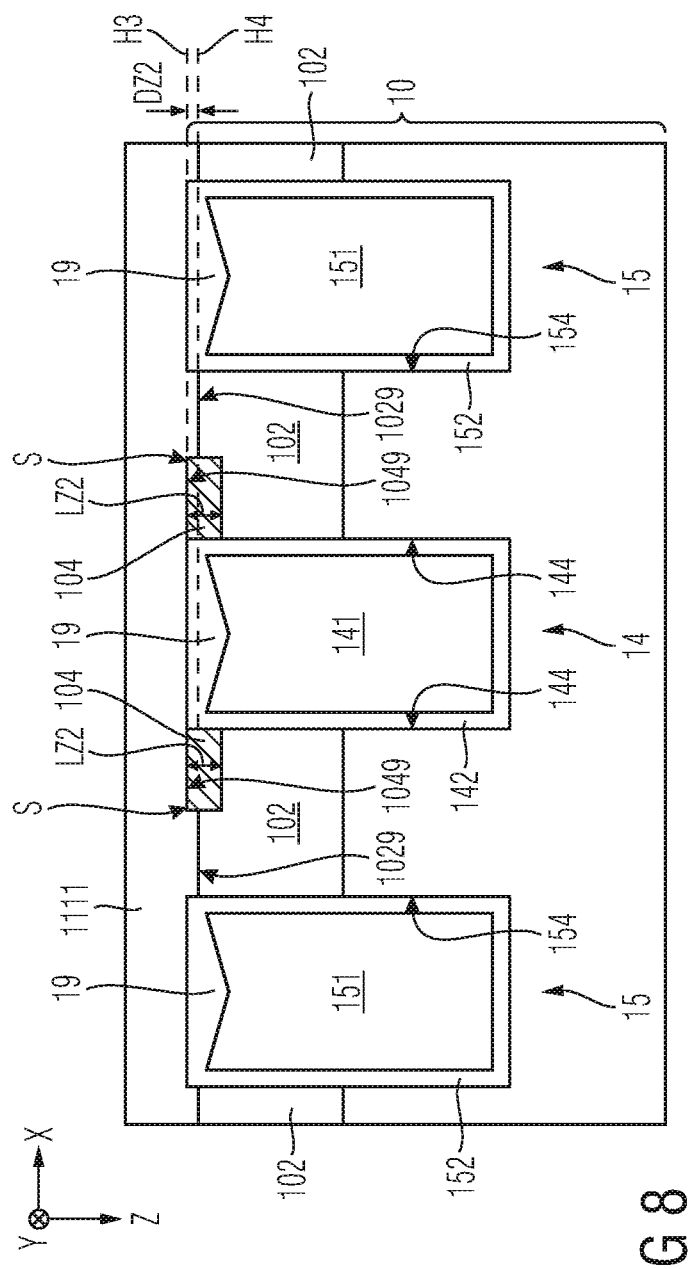
FIG. 8 schematically and exemplarily illustrates a section of a vertical cross-section of a power semiconductor device in accordance with one or more embodiments.

FIG. 8 schematically and exemplarily illustrates a section of a vertical cross-section of a power semiconductor device 1 in accordance with one or more further embodiments. For example, the power semiconductor device 1 of FIG. 8 may have been produced by the method that has been explained above with reference to, FIGS. 5A-5F. In fact, FIG. 8 is an enlarged view of the left panel of FIG. 5F. The various parts of the power semiconductor device 1 shown in FIG. 8 thus have already been addressed above with reference to FIGS. 5A-5F and will therefore not be explained again here.

As shown in FIG. 8, a third contact surface 1049 between the elevated source regions 104 and the conductive layer 1111 extends in a third horizontal plane H3. Further, a fourth contact surface 1029 between the recessed body regions 1021 and the conductive layer 1111 extends essentially in fourth horizontal plane H4, wherein the fourth horizontal plane H4 is located vertically below the third horizontal plane H3. For example, the mesa 105 may thus exhibit at least two different mesa heights, which may be, for example, due to the first etch process referred to above. For example, the semiconductor body surface 100 may exhibit a step S (such as, e g., an essentially vertical step S or a tilted step) at a lateral transition between each elevated source region 104 and an adjacent recessed body region 1021.

For example, a second vertical distance DZ2 between the third horizontal plane H3 and the fourth horizontal plane H4 amounts to at least 10 nm, such as at least 25 nm, at least 50 nm, or even at least 250 nm. Additionally or alternatively, the second vertical distance DZ2 may be smaller than a second vertical extension LZ2 of the respective elevated source region 104 having said third contact surface 1049 with the conductive layer 1111.

FIG. 9A-9C schematically and exemplarily illustrate a further variant of the method according the present invention, wherein the recess mask layer 2 covers a control trench 14 along its longitudinal extension (at least in the active cell region). For example, a plurality of such control trenches 14 that are each covered by the recess mask layer 2 may be provided (not illustrated). For example, the processing stage depicted in FIG. 9A may correspond to the processing stage explained above with regard to FIG. 2B. In a subsequent step, in contrast to FIG. 2C, a recess mask layer 2 is formed such that it covers also the control trenches 14 (see right panel of FIG. 9B). Thus, the control trenches 4 may be protected in the further processing steps. For example, in an embodiment, all trenches comprising electrodes that receive the control signal may thus be protected by the recess mask layer 2 during the first etch process. This is further illustrated in FIG. 9C which shows the situation after the first etch process and before removal of the recess mask layer 2. In an embodiment, so-called dummy trenches may also be covered by respective portions of the recess mask layer 2 and may thus be protected during a subsequent etch process.

Embodiments of the method of forming a power semiconductor device described above correspond to the embodiments of the power semiconductor as described above, and vice versa. Hence, for example, the features of the embodiments of the power semiconductor device described above may be achieved by carrying out corresponding processing method step.

The embodiments described above include the recognition that the reliability of a power semiconductor device, such as its ruggedness with regard to latch-up induced destruction, may be significantly improved by means of a dedicated masked etch process that reliably defines the location and lateral extension of source regions of the device.

In accordance with one or more embodiments a plurality of elevated source regions of a first conductivity type may be formed at a surface of a semiconductor body adjacent to a control electrode, wherein forming the elevated source regions comprises:
  implanting dopants of the first conductivity type into the semiconductor body;
  forming a recess mask layer on the semiconductor body surface, wherein the recess mask layer covers at least the areas of intended source regions; and
  removing portions of the semiconductor body that are uncovered by the recess mask layer by means of a first etch process to form the elevated source regions and recessed body regions adjacent to the elevated source regions.

By means of such a sacrificial etch process, defects in the form of source islands having an excessive area may be corrected for. Thus, latch-up due, e.g., an excessive with of a defective source island may be avoided. In other words, the first etch process may provide for a redundancy measure which increases the reliability of the processed power semiconductor device. For example, in some embodiments, as a result of this redundancy measure, two defects would need to occur independently at the same position of the semiconductor body surface to render the device prone to a destructive latch-up: namely, a defect in a structured source implantation defining, e.g., source stripes or source islands and a defect in the structured sacrificial etch process according to the present invention. Thus, the probability of failures may be effectively reduced by means of the proposed additional etch process.

In the above, embodiments pertaining to power semiconductor switches and corresponding processing methods were explained. For example, these semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a power semiconductor device, the method comprising:
providing a semiconductor body having a surface;
arranging a control electrode at least partially on or inside the semiconductor body, the control electrode configured to control a load current in the semiconductor body;
forming a plurality of elevated source regions of a first conductivity type in the semiconductor body adjacent to the control electrode, wherein forming the plurality of elevated source regions comprises:
implanting dopants of the first conductivity type into the semiconductor body;
forming a recess mask layer on the surface of the semiconductor body, the recess mask layer covering at least areas of intended source regions and comprising a different material than the control electrode; and
removing portions of the semiconductor body that are uncovered by the recess mask layer by means of a first etch process, to form the elevated source regions and recessed body regions adjacent to the elevated source regions, wherein the recessed body regions are arranged at least partially between the elevated source regions;
forming a dielectric layer on the surface of the semiconductor body;
forming a contact hole mask layer on the dielectric layer;
removing portions of the dielectric layer uncovered by the contact hole mask layer by means of a second etch process, to form a contact hole; and
filling the contact hole at least partially with a conductive material, to establish an electrical contact with at least a portion of the elevated source regions and at least a portion of the recessed body regions.

2. The method of claim 1, wherein implanting the dopants of the first conductivity type into the semiconductor body comprises a masked implantation step using an implant mask layer, the implant mask layer having a plurality of separate openings comprising at least the areas of the intended source regions.

3. The method of claim 1, further comprising a temperature annealing step carried out after the first etch process.

4. The method of claim 3, wherein during the first etch process the portions of the semiconductor body that are uncovered by the recess mask layer are etched away down to an etching depth that is smaller than a final vertical extension of the elevated source regions after the temperature annealing step.

5. The method of claim 1, wherein during the first etch process the portions of the semiconductor body that are uncovered by the recess mask layer are etched away at least down to an etching depth corresponding to a projected range of the implantation of dopants of the first conductivity type.

6. The method of claim 1, further comprising forming a body region in the semiconductor body by a first implantation of dopants of a second conductivity type complementary to the first conductivity type, wherein the recessed body regions are included in the body region.

7. The method of claim 6, further comprising, after the first etch process, a second implantation of dopants of the second conductivity type into at least a portion of the recessed body regions.

8. The method of claim 1, further comprising forming at least two trenches extending from the surface along a vertical direction into the semiconductor body, wherein two trench sidewalls facing each other of two adjacent ones of the at least two trenches laterally confine a mesa region of the semiconductor body along a first lateral direction, wherein the elevated source regions and the recessed body regions are formed inside the mesa region.

9. The method of claim 8, wherein in a top view on the surface of the semiconductor body, the areas of the intended source regions are distributed along at least one of the at least two trenches and are spaced apart from each other along a main lateral extension direction of the respective trench.

10. The method of claim 9, wherein in the top view the areas of the intended source regions comprise a plurality of source stripes and/or source islands.

11. The method of claim 9, wherein an extension of the areas of the intended source regions along the main lateral extension direction amounts to at most 5 μm.

12. The method of claim 8, wherein the at least two trenches are formed as a control trench comprising the control electrode and a source trench comprising a source electrode.

13. The method of claim 8, wherein the two trench sidewalls are spaced apart along the first lateral direction by at most 5 μm.

14. The method of claim 1, wherein the recess mask layer covers a plurality of control trenches.

15. The method of claim 1, wherein the recess mask layer is a structured resist layer.

16. A method of forming a power semiconductor device, the method comprising:
   providing a semiconductor body having a surface;
   arranging a control electrode at least partially on or inside the semiconductor body, the control electrode configured to control a load current in the semiconductor body;
   forming a plurality of elevated source regions of a first conductivity type in the semiconductor body adjacent to the control electrode, wherein forming the plurality of elevated source regions comprises:
      implanting dopants of the first conductivity type into the semiconductor body;
      forming a recess mask layer on the surface of the semiconductor body, the recess mask layer covering at least areas of intended source regions; and
      removing portions of the semiconductor body that are uncovered by the recess mask layer by means of a first etch process, to form the elevated source regions and recessed body regions adjacent to the elevated source regions, wherein the recessed body regions are arranged at least partially between the elevated source regions;
   forming a dielectric layer on the surface of the semiconductor body;
   forming a contact hole mask layer on the dielectric layer;
   removing portions of the dielectric layer uncovered by the contact hole mask layer by means of a second etch process, to form a contact hole; and
   filling the contact hole at least partially with a conductive material, to establish an electrical contact with at least a portion of the elevated source regions and at least a portion of the recessed body regions,
   wherein the dopants of the first conductivity type are implanted into the semiconductor body after the control electrode is completely formed,
   wherein the recess mask layer is formed on the surface of the semiconductor body after the control electrode is completely formed,
   wherein the recess mask layer covers a trench that includes the control electrode.

17. The method of claim 16, wherein the recess mask layer is a structured resist layer.

* * * * *